(12) United States Patent
Kawashima et al.

(10) Patent No.: US 11,521,569 B2
(45) Date of Patent: Dec. 6, 2022

(54) DISPLAY APPARATUS AND ELECTRONIC DEVICE

(71) Applicant: SEMICONDUCTOR ENERGY LABORATORY CO., LTD., Atsugi (JP)

(72) Inventors: Susumu Kawashima, Kanagawa (JP); Naoto Kusumoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/256,819

(22) PCT Filed: Jun. 25, 2019

(86) PCT No.: PCT/IB2019/055325
§ 371 (c)(1),
(2) Date: Dec. 29, 2020

(87) PCT Pub. No.: WO2020/008299
PCT Pub. Date: Jan. 9, 2020

(65) Prior Publication Data
US 2021/0366422 A1 Nov. 25, 2021

(30) Foreign Application Priority Data
Jul. 5, 2018 (JP) .............................. JP2018-128173

(51) Int. Cl.
*G09G 3/36* (2006.01)
*H01L 27/12* (2006.01)
(Continued)

(52) U.S. Cl.
CPC ....... *G09G 3/3648* (2013.01); *H01L 27/1225* (2013.01); *G02F 1/1368* (2013.01);
(Continued)

(58) Field of Classification Search
CPC ......... G09G 3/3648; G09G 2300/0426; G09G 2300/0465; G09G 2320/02; G09G 3/3275;
(Continued)

(56) References Cited

U.S. PATENT DOCUMENTS 6,909,413 B2   6/2005 Nanno et al.
7,084,848 B2   8/2006 Senda et al.
(Continued)

FOREIGN PATENT DOCUMENTS

CN   102737586 A   10/2012
CN   103777421 A   5/2014
(Continued)

OTHER PUBLICATIONS

International Search Report (Application No. PCT/IB2019/055325) dated Oct. 1, 2019.
(Continued)

*Primary Examiner* — Rodney Amadiz
(74) *Attorney, Agent, or Firm* — Fish & Richardson P.C.

(57) ABSTRACT

A display apparatus capable of improving image quality is provided. In the display apparatus, an adder circuit is provided inside and outside a display region, and the adder circuit has a function of adding a plurality of pieces of data supplied from a source driver. Some components of the adder circuit are separately arranged in a pixel region. Thus, limitation on the size of a component included in the adder circuit can be eased, and data addition can be performed efficiently. In addition, by providing the other components included in the adder circuit outside the display region, the number of wirings in the display region can be reduced and the aperture ratio of the pixel can be increased.

18 Claims, 27 Drawing Sheets

(51) Int. Cl.
*G02F 1/1368* (2006.01)
*H01L 27/32* (2006.01)

(52) U.S. Cl.
CPC .............. *G09G 2300/0426* (2013.01); *G09G 2300/0465* (2013.01); *G09G 2320/02* (2013.01); *H01L 27/3262* (2013.01)

(58) Field of Classification Search
CPC .............. G09G 3/3688; G09G 3/3233; G09G 2300/0809; G09G 2300/0895; G09G 2310/027; G09G 2310/0297; G09G 2310/08; G09G 3/20; G09G 3/3225; H01L 27/1225; H01L 27/3262; H01L 29/786; H01L 51/50; H01L 27/32; H01L 29/7869; G02F 1/1368; G09F 9/30; H05B 33/14
See application file for complete search history.

(56) References Cited

U.S. PATENT DOCUMENTS

| | | | |
|---|---|---|---|
| 7,674,650 B2 | 3/2010 | Akimoto et al. | |
| 8,054,393 B2 | 11/2011 | Takahashi | |
| 8,860,108 B2 | 10/2014 | Yamazaki et al. | |
| 10,423,254 B2 | 9/2019 | Miyake et al. | |
| 2008/0055222 A1 | 3/2008 | Chen et al. | |
| 2009/0109360 A1 | 4/2009 | Takahashi | |
| 2012/0249509 A1 | 10/2012 | Kim et al. | |
| 2014/0111491 A1 | 4/2014 | Lee | |
| 2016/0055817 A1 | 2/2016 | Kuo | |
| 2017/0345369 A1 | 11/2017 | Lai et al. | |
| 2018/0039882 A1* | 2/2018 | Ikeda | G06N 3/04 |
| 2018/0337209 A1* | 11/2018 | Narui | H01L 27/14636 |
| 2020/0279525 A1 | 9/2020 | Kawashima et al. | |
| 2020/0326570 A1 | 10/2020 | Kawashima et al. | |
| 2020/0341340 A1 | 10/2020 | Takahashi et al. | |
| 2020/0357354 A1 | 11/2020 | Kawashima et al. | |
| 2021/0181561 A1 | 6/2021 | Kawashima et al. | |
| 2021/0280146 A1* | 9/2021 | Kawashima | H01L 27/3265 |

FOREIGN PATENT DOCUMENTS

| | | |
|---|---|---|
| CN | 104575418 A | 4/2015 |
| CN | 106211413 A | 12/2016 |
| CN | 107437401 A | 12/2017 |
| EP | 2506247 A | 10/2012 |
| JP | 2007-096055 A | 4/2007 |
| JP | 2007-123861 A | 5/2007 |
| JP | 2009-109600 A | 5/2009 |
| JP | 2011-039269 A | 2/2011 |
| JP | 2011-119674 A | 6/2011 |
| JP | 2014-215495 A | 11/2014 |
| KR | 2012-0110387 A | 10/2012 |
| KR | 2014-0052342 A | 5/2014 |
| KR | 2014-0143989 A | 12/2014 |
| TW | 200813951 | 3/2008 |
| TW | 200905646 | 2/2009 |
| TW | 201608555 | 3/2016 |
| WO | WO-2002/035507 | 5/2002 |

OTHER PUBLICATIONS

Written Opinion (Application No. PCT/IB2019/055325) dated Oct. 1, 2019.

Chinese Office Action (Application No. 201980042063.4) dated Feb. 24, 2022.

* cited by examiner

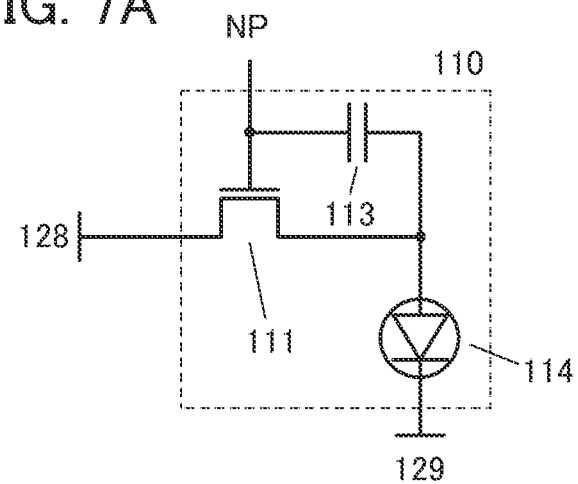
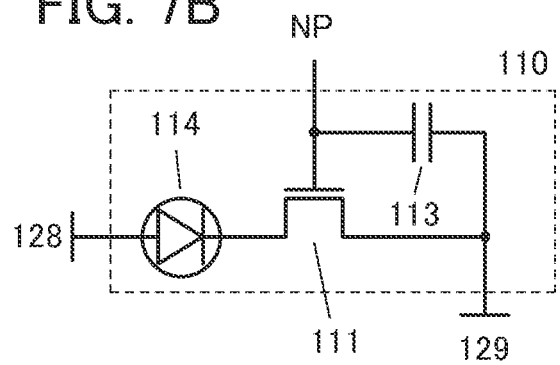
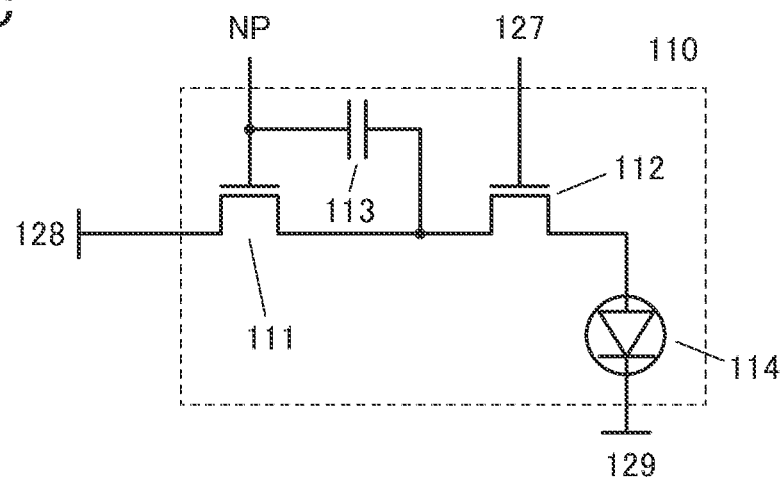
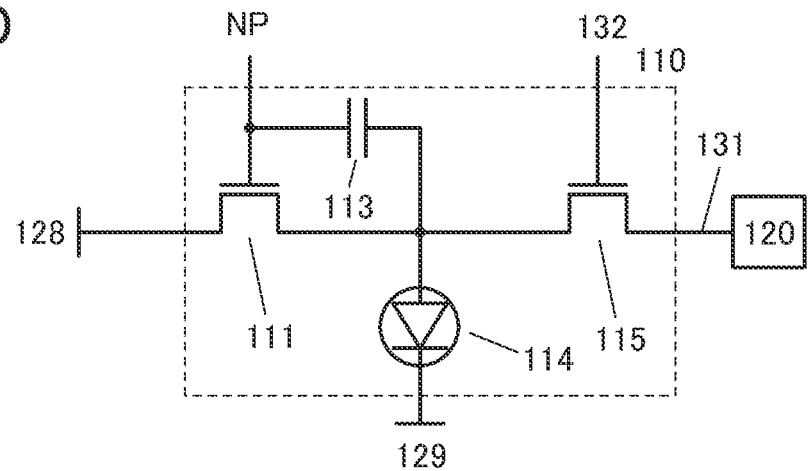

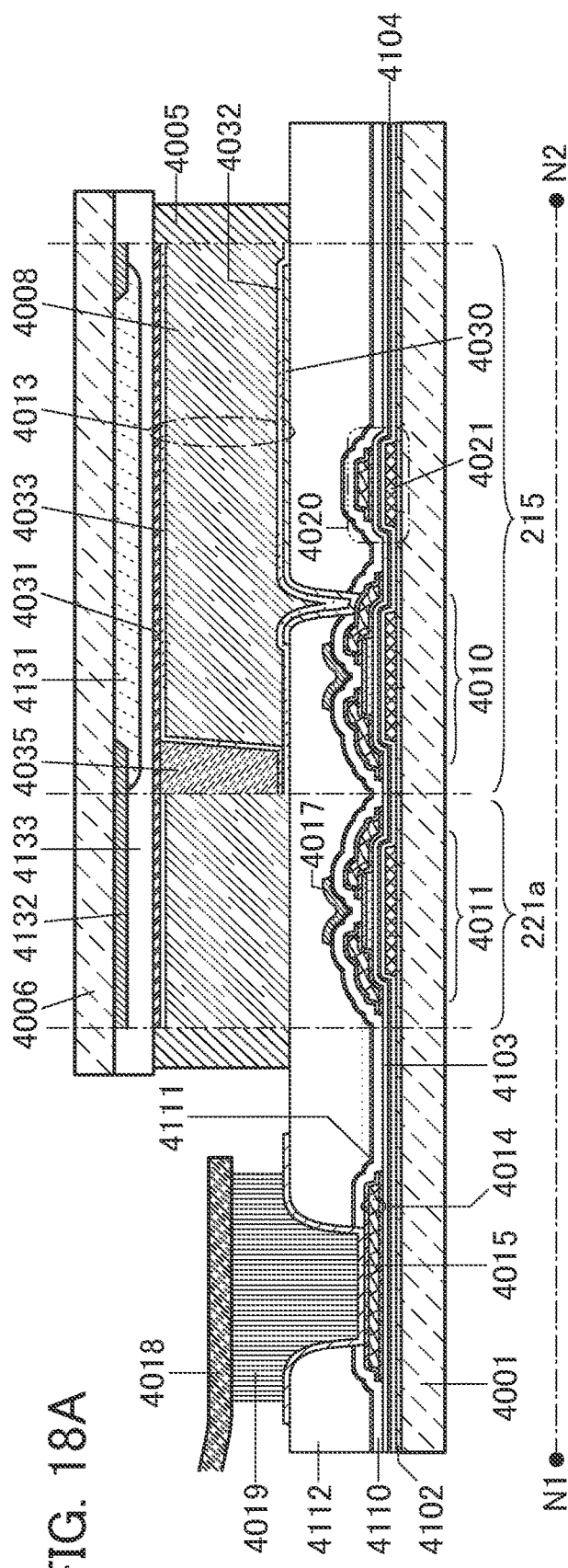

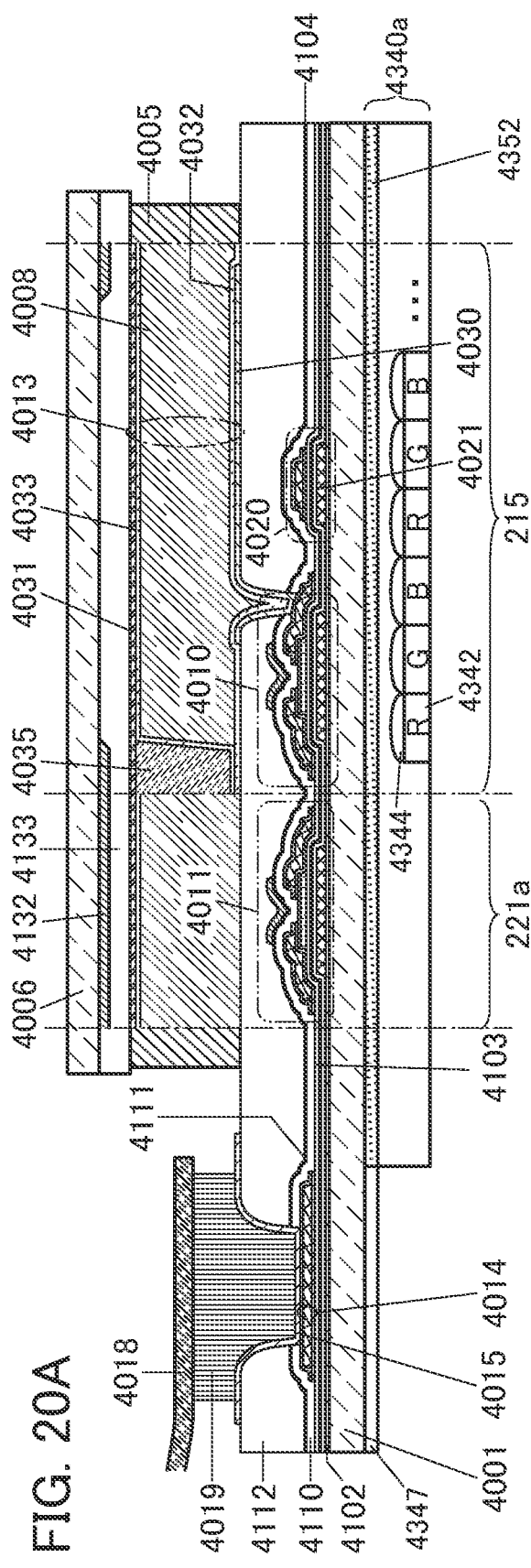
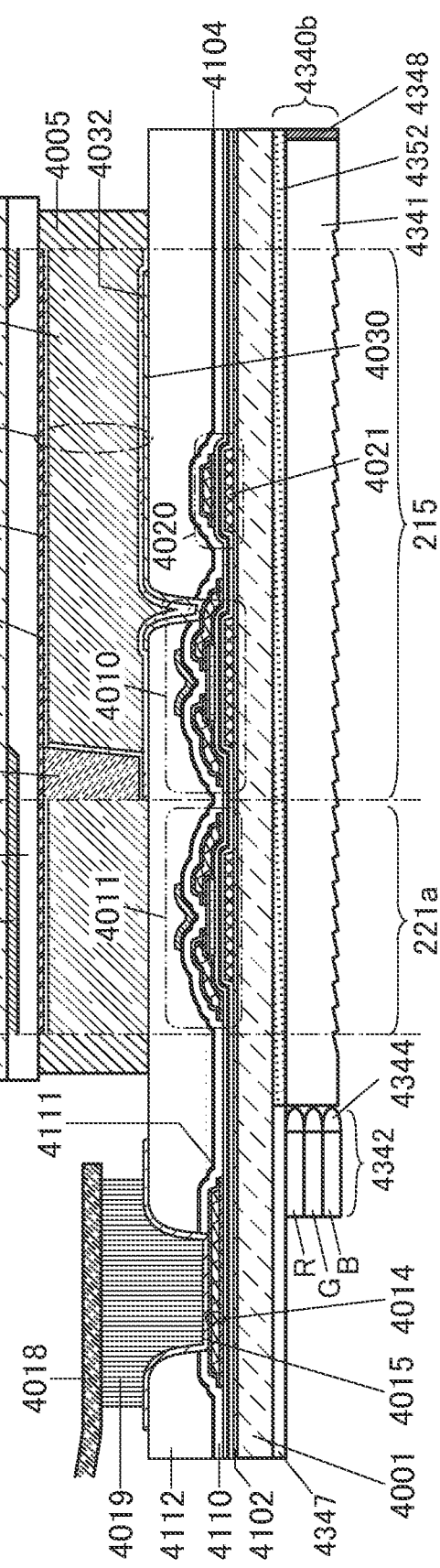
FIG. 20A
FIG. 20B

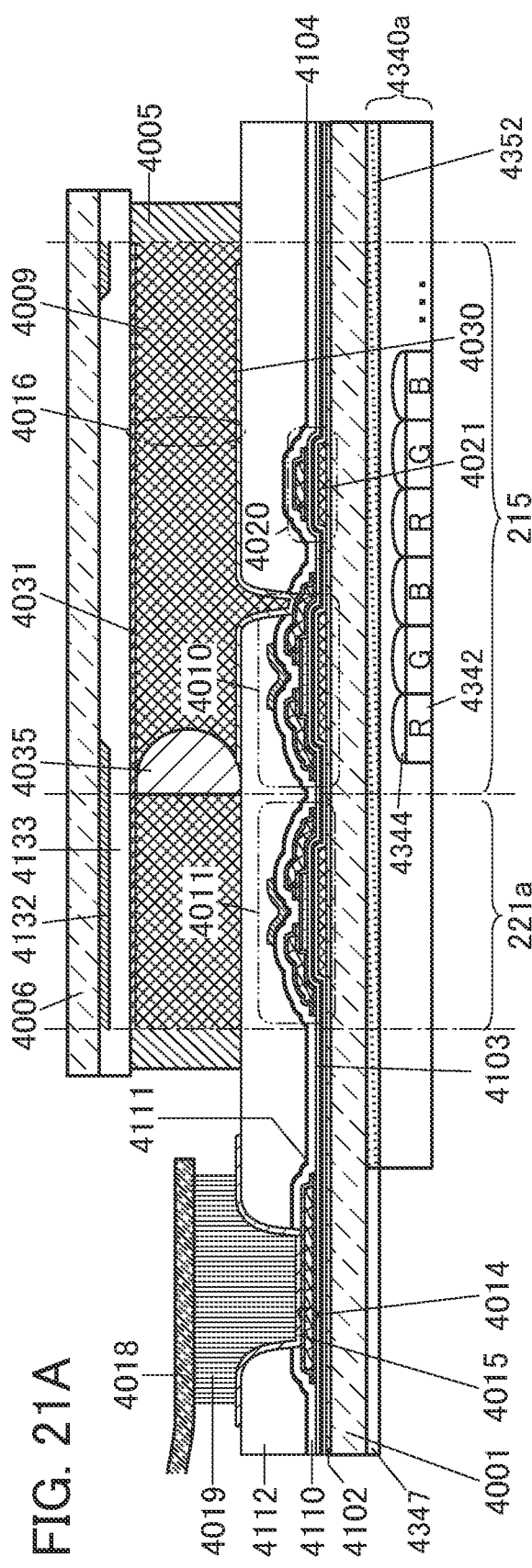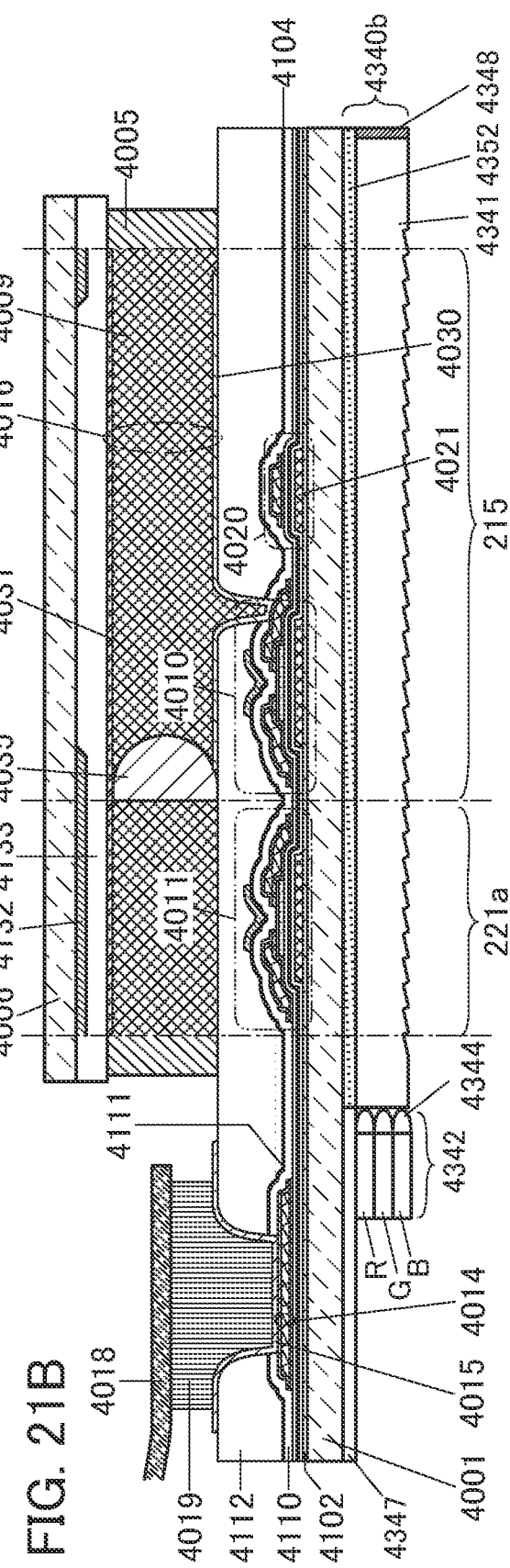

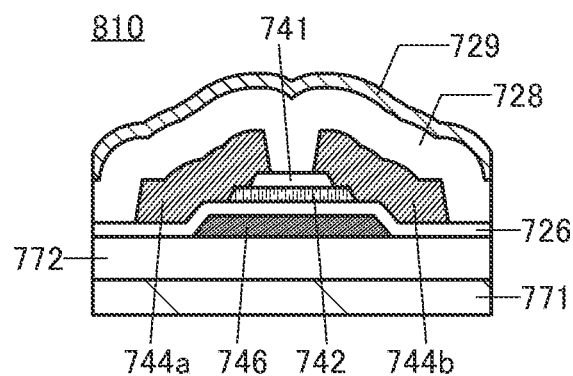
FIG. 23A1
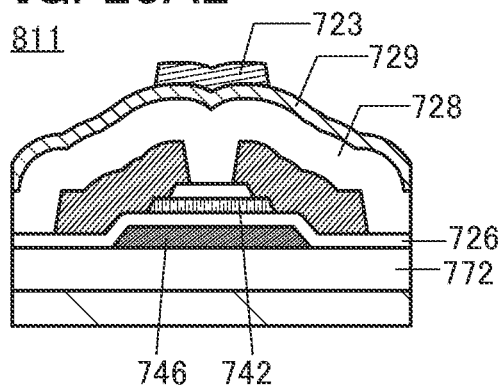
FIG. 23A2
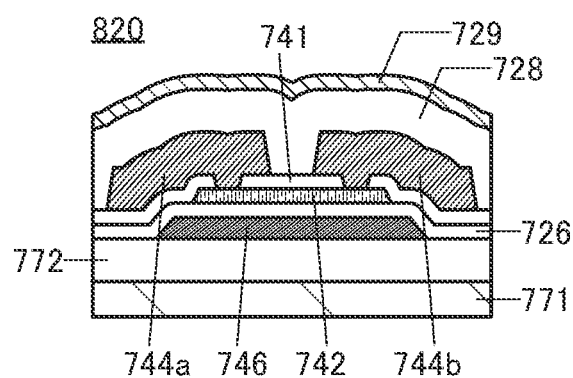
FIG. 23B1
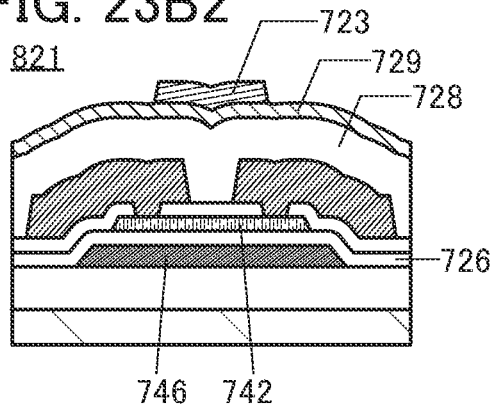
FIG. 23B2
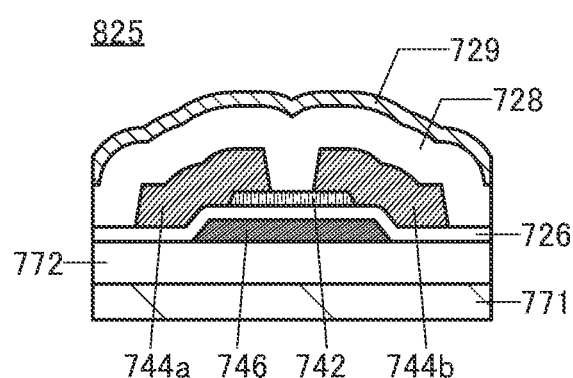
FIG. 23C1
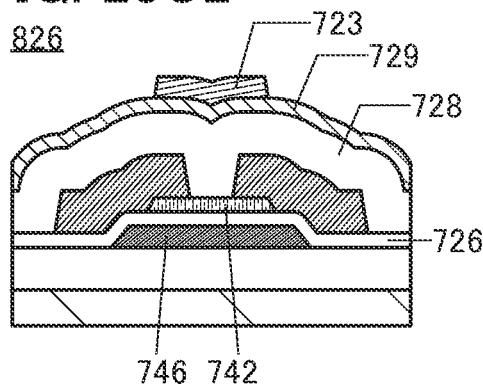
FIG. 23C2

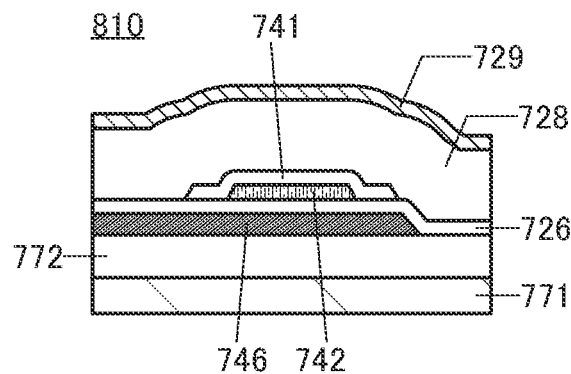
FIG. 24A1
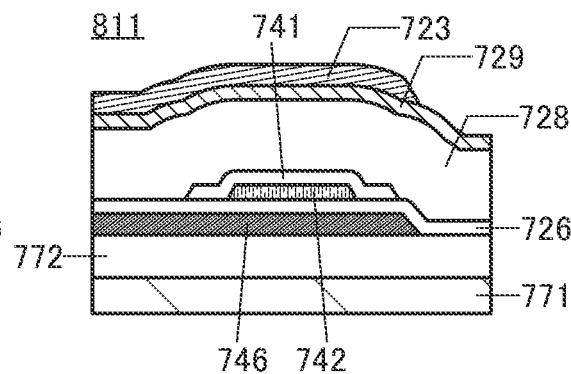
FIG. 24A2
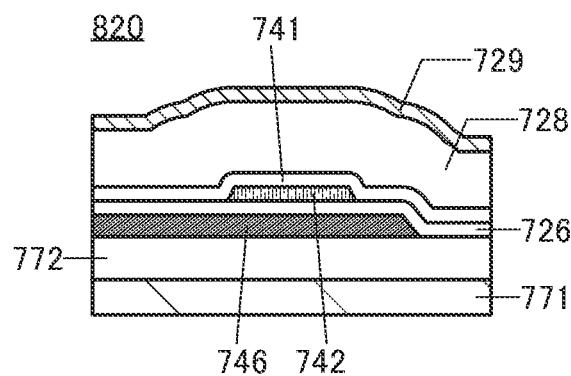
FIG. 24B1
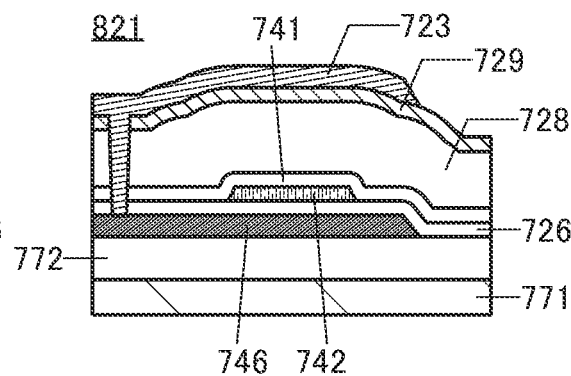
FIG. 24B2
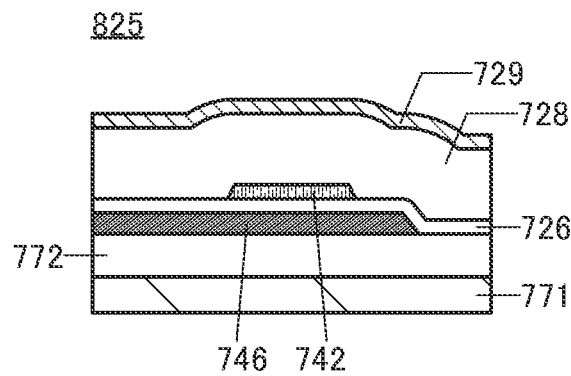
FIG. 24C1
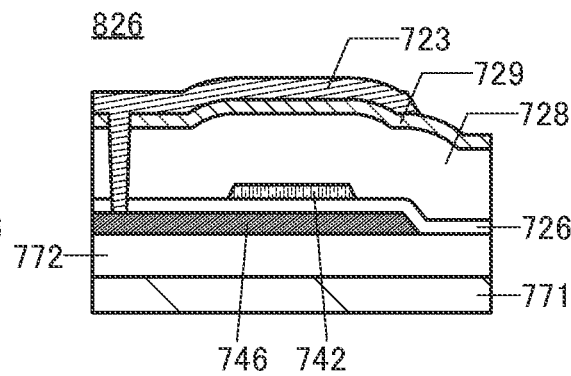
FIG. 24C2

FIG. 25A1
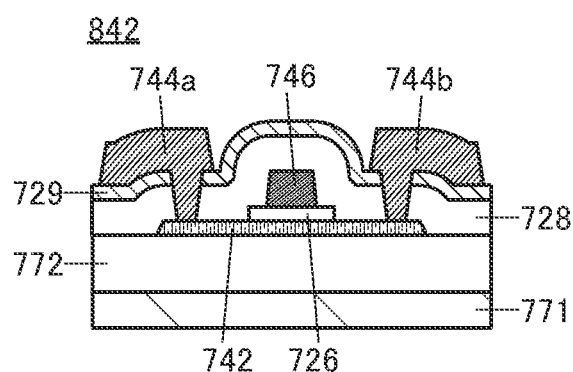
FIG. 25A2
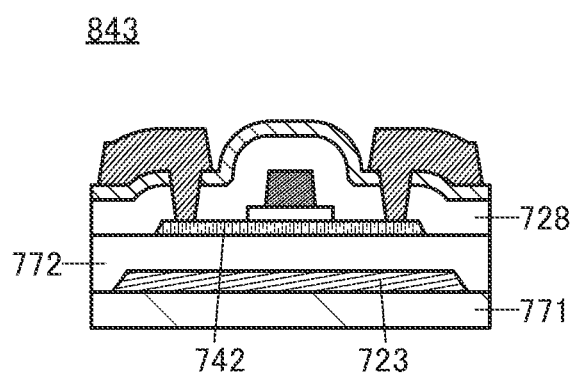
FIG. 25B1
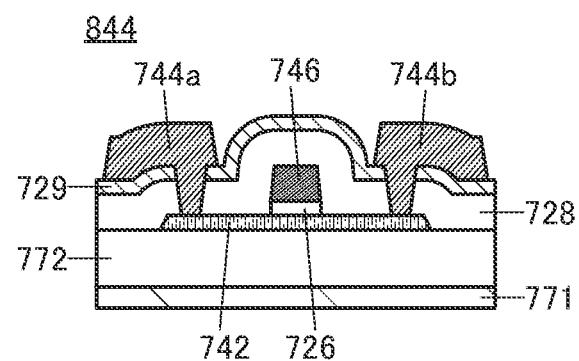
FIG. 25B2
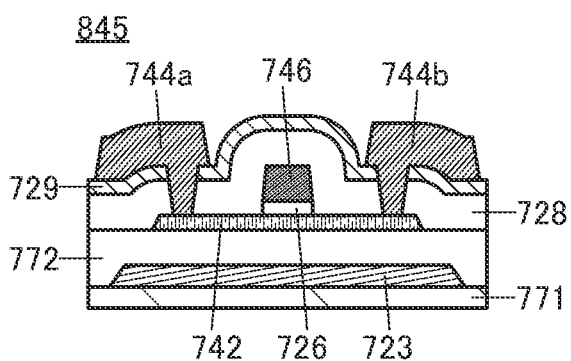
FIG. 25C1
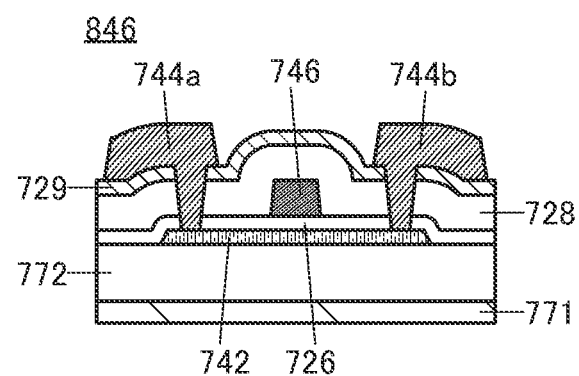
FIG. 25C2
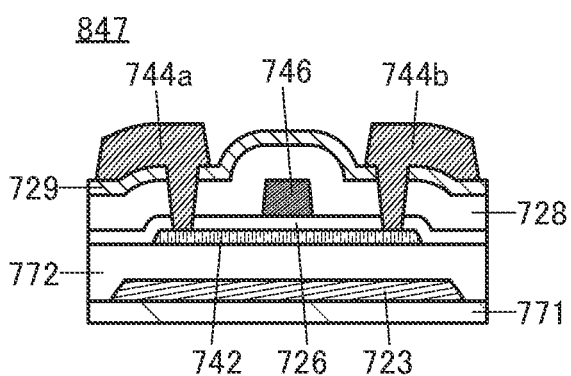

FIG. 26A1
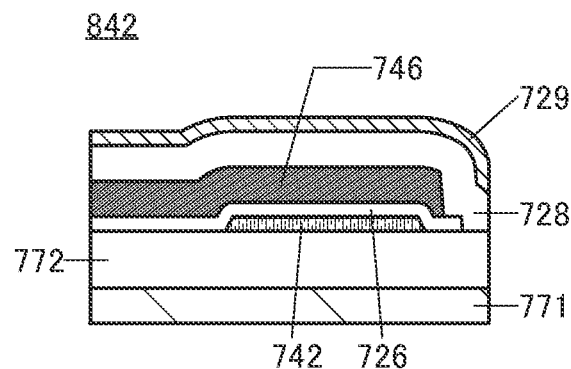
FIG. 26A2
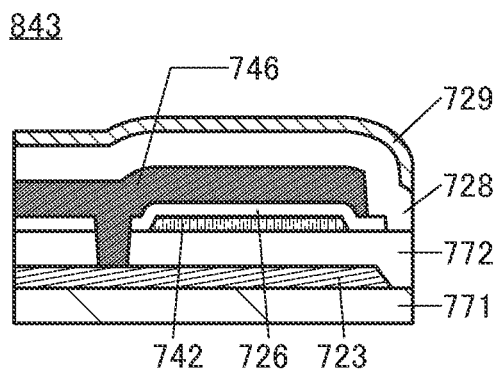
FIG. 26B1
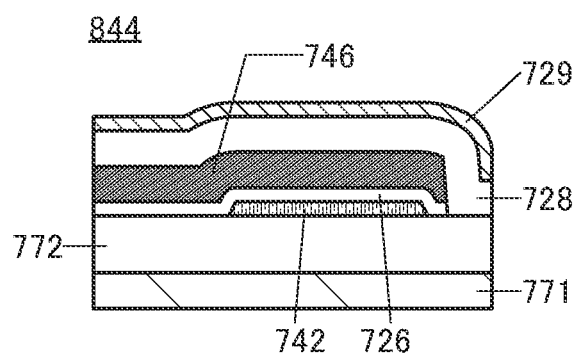
FIG. 26B2
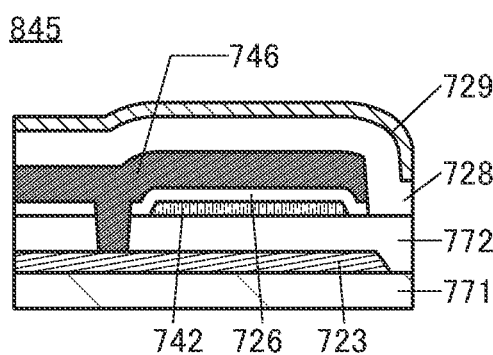
FIG. 26C1
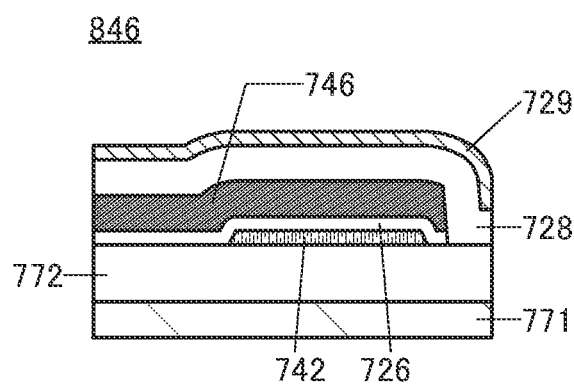
FIG. 26C2
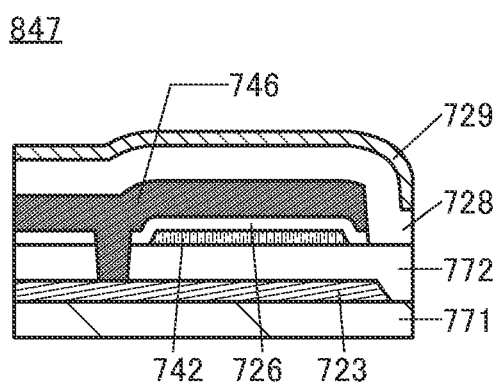

DISPLAY APPARATUS AND ELECTRONIC DEVICE

CROSS REFERENCE TO RELATED APPLICATIONS

This application is a U.S. National Phase Application under 35 U.S.C. § 371 of International Application PCT/IB2019/055325, filed on Jun. 25, 2019, which is incorporated by reference and claims the benefit of a foreign priority application filed in Japan on Jul. 5, 2018, as Application No. 2018-128173.

TECHNICAL FIELD

One embodiment of the present invention relates to a display apparatus.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display apparatus, a liquid crystal display apparatus, a light-emitting apparatus, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display apparatus, an imaging device, or an electronic device includes a semiconductor device.

BACKGROUND ART

A technique for forming transistors using a metal oxide formed over a substrate has been attracting attention. For example, a technique in which a transistor formed using zinc oxide or an In—Ga—Zn-based oxide is used as a switching element or the like of a pixel of a display apparatus is disclosed in Patent Document 1 and Patent Document 2.

Patent Document 3 discloses a memory device having a structure in which a transistor with an extremely low off-state current is used in a memory cell.

REFERENCES

Patent Documents

[Patent Document 1] Japanese Published Patent Application No. 2007-123861
[Patent Document 2] Japanese Published Patent Application No. 2007-96055
[Patent Document 3] Japanese Published Patent Application No. 2011-119674

SUMMARY OF THE INVENTION

Problems to be Solved by the Invention

High resolution display apparatuses capable of displaying images of an 8K4K (pixel number: 7680×4320) or higher resolution have been developed. In addition, the HDR (high dynamic range) display technique, which increases image quality by luminance adjustment, has been introduced.

To clearly display an image with gradation, it is preferable to operate a display device using data potentials in a wide range. Meanwhile, the output voltage of a source driver for a liquid crystal display apparatus is approximately 10 to 20 V, for example, and supplying a higher voltage to the display device requires a high output source driver to be used. A high output source driver consumes high power, and requires a new driver IC to be developed in some cases.

Thus, an object of one embodiment of the present invention is to provide a display apparatus capable of improving image quality. Another object is to provide a display apparatus capable of supplying voltage higher than or equal to the output voltage of a source driver to a display device. Another object is to provide a display apparatus capable of enhancing the luminance of a displayed image. Another object is to provide a display apparatus in which the aperture ratio of a pixel can be increased.

Another object is to provide a display apparatus with low power consumption. Another object is to provide a highly reliable display apparatus. Another object is to provide a novel display apparatus or the like. Another object is to provide a method for driving any of the above display apparatuses. Another object is to provide a novel semiconductor device or the like.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems

One embodiment of the present invention relates to a display apparatus capable of improving image quality.

One embodiment of the present invention is a display apparatus including a pixel and a first circuit; in the display apparatus, the pixel and the first circuit are electrically connected to each other, the first circuit has a function of adding first data and second data to generate third data, and the pixel has a function of adding the first data and the third data to generate fourth data and a function of displaying an image according to the fourth data.

Another embodiment of the present invention is a display apparatus including a pixel and a first circuit; in the display apparatus, the pixel and the first circuit are electrically connected to each other, the first circuit has a function of adding first data and second data to generate third data, and the pixel has a function of adding the third data to the third data to generate fourth data and a function of displaying an image according to the fourth data.

The first circuit can include a first transistor, a second transistor, a third transistor, and a first capacitor; one of a source and a drain of the first transistor can be electrically connected to the pixel; the one of the source and the drain of the first transistor can be electrically connected to one electrode of the first capacitor; the other electrode of the first capacitor can be electrically connected to one of a source and a drain of the second transistor; the one of the source and the drain of the second transistor can be electrically connected to one of a source and a drain of the third transistor; and the other of the source and the drain of the first transistor can be electrically connected to the other of the source and the drain of the second transistor.

The first capacitor can include a plurality of second capacitors, and the second capacitors can be connected in parallel.

The pixel can include a fourth transistor, a fifth transistor, a sixth transistor, a third capacitor, and a second circuit; one of a source and a drain of the fourth transistor can be electrically connected to one electrode of the third capacitor; the one electrode of the third capacitor can be electrically connected to the second circuit; the other electrode of the third capacitor can be electrically connected to one of a source and a drain of the fifth transistor; the one of the source and the drain of the fifth transistor can be electrically connected to one of a source and a drain of the sixth transistor; the other of the source and the drain of the fourth transistor can be electrically connected to the first circuit; the other of the source and the drain of the fifth transistor can be electrically connected to the first circuit; and the second circuit can include a display device.

The second circuit can include a seventh transistor, a fourth capacitor, and a light-emitting device as the display device; a gate of the seventh transistor can be electrically connected to the other of the source and the drain of the fourth transistor; one of a source and a drain of the seventh transistor can be electrically connected to one electrode of the light-emitting device; the one electrode of the light-emitting device can be electrically connected to one electrode of the fourth capacitor; and the other electrode of the fourth capacitor can be electrically connected to the gate of the seventh transistor.

Alternatively, the second circuit may include a liquid crystal device as the display device, and one electrode of the liquid crystal device may be electrically connected to the one of the source and the drain of the fourth transistor. Furthermore, a fifth capacitor may be included, and one electrode of the fifth capacitor may be electrically connected to the one electrode of the liquid crystal device.

It is preferable that the transistors included in the first circuit and the pixel each contain a metal oxide in a channel formation region, and that the metal oxide include In, Zn, and M (M is Al, Ti, Ga, Sn, Y, Zr, La, Ce, Nd, or Hf).

The channel width of each of the transistors included in the first circuit is preferably larger than the channel width of each of the transistors included in the pixel.

Effect of the Invention

With the use of one embodiment of the present invention, a display apparatus capable of improving image quality can be provided. Alternatively, a display apparatus capable of supplying voltage higher than or equal to the output voltage of a source driver to a display device can be provided. Alternatively, a display apparatus capable of enhancing the luminance of a displayed image can be provided. Alternatively, a display apparatus in which the aperture ratio of a pixel can be increased can be provided.

Alternatively, a display apparatus with low power consumption can be provided. Alternatively, a highly reliable display apparatus can be provided. Alternatively, a novel display apparatus or the like can be provided. Alternatively, a method for operating any of the above display apparatuses can be provided. Alternatively, a novel semiconductor device or the like can be provided.

BRIEF DESCRIPTION OF THE DRAWINGS

FIG. 7(A) to FIG. 7(D) are diagrams each illustrating a circuit block.
FIG. 18(A) and FIG. 18(B) are diagrams each illustrating a display apparatus.
FIG. 20(A) and FIG. 20(B) are diagrams each illustrating a display apparatus.
FIG. 21(A) and FIG. 21(B) are diagrams each illustrating a display apparatus.
FIG. 23(A1) to FIG. 23(C2) are diagrams each illustrating a transistor.
FIG. 24(A1) to FIG. 24(C2) are diagrams each illustrating a transistor.
FIG. 25(A1) to FIG. 25(C2) are diagrams each illustrating a transistor.
FIG. 26(A1) to FIG. 26(C2) are diagrams each illustrating a transistor.

MODE FOR CARRYING OUT THE INVENTION

Figure 1:
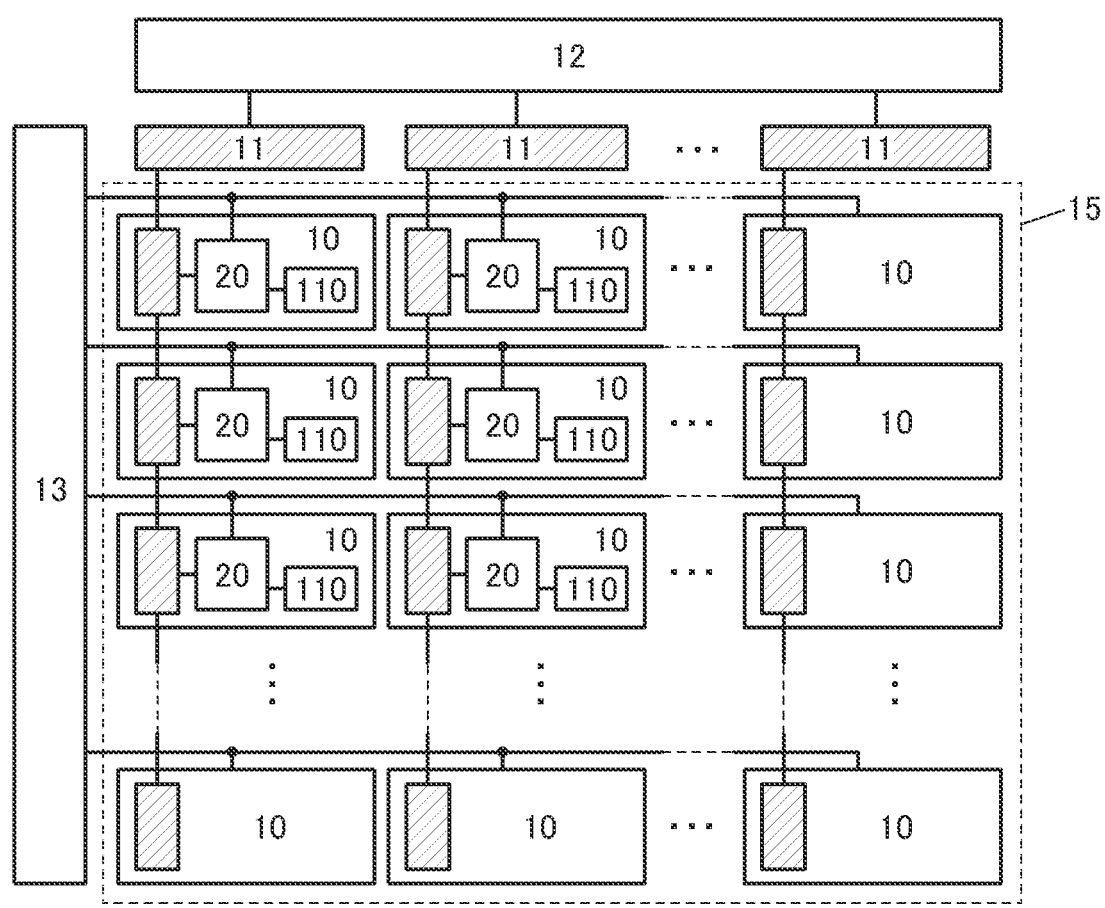
FIG. 1 is a diagram illustrating a display apparatus.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are separately arranged in a plurality of positions.

One conductor has a plurality of functions such as a wiring, an electrode, and a terminal in some cases, and in this specification, a plurality of names are used for the same component in some cases. Even in the case where components are illustrated in a circuit diagram as if they were directly connected to each other, the components may actually be connected to each other through a plurality of conductors; in this specification, even such a configuration is included in direct connection.

Embodiment 1

In this embodiment, a display apparatus that is one embodiment of the present invention will be described with reference to drawings.

One embodiment of the present invention is a display apparatus including a circuit having a function of adding data (hereinafter, adder circuit) and a pixel also having a function of adding data.

The adder circuit has a function of adding data supplied from a source driver. The pixel has a function of adding data supplied from the adder circuit. Accordingly, the display apparatus of one embodiment of the present invention can generate a voltage several times higher than the output voltage of the source driver and can supply the voltage to a display device.

The adder circuit is electrically connected to pixels arranged in a column direction in a display region, and some components thereof can be separately arranged in a pixel region. Thus, limitation on the size of a component included in the adder circuit can be eased, and data addition can be performed efficiently. In addition, by providing the other components included in the adder circuit outside the display region, the number of wirings in the display region can be reduced and the aperture ratio of the pixel can be increased.

FIG. 1 is a diagram illustrating a display apparatus of one embodiment of the present invention. The display apparatus includes pixels 10 arranged in a column direction and in a row direction, a source driver 12, a gate driver 13, and circuits 11. The source driver 12 is electrically connected to the circuits 11. The gate driver 13 is electrically connected to the pixels 10. The circuits 11 are electrically connected to the pixels 10. Although FIG. 1 illustrates an example in which one gate driver 13 is provided along one side of a display region 15, another gate driver 13 may be additionally provided along a side opposite to the one side and the pixels 10 may be driven by the two gate drivers.

Each of the circuits 11 can be provided for one column and is electrically connected to all the pixels 10 arranged in the same column. Components of the circuit 11 can be provided in and outside the display region.

The circuit 11 is an adder circuit, and has a function of adding first data and second data supplied from the source driver 12 by capacitive coupling to generate third data.

The pixels 10 each include a circuit 20 and a circuit block 110. The circuit 20 has a function of adding the first data and the third data supplied from the adder circuit by capacitive coupling to generate fourth data. Alternatively, the circuit 20 has a function of adding the third data to the third data supplied from the adder circuit by capacitive coupling to generate fifth data. The circuit block 110 includes a display device, and has a function of displaying an image by the display device according to the fourth data or the fifth data supplied from the circuit 20.

Figure 2:
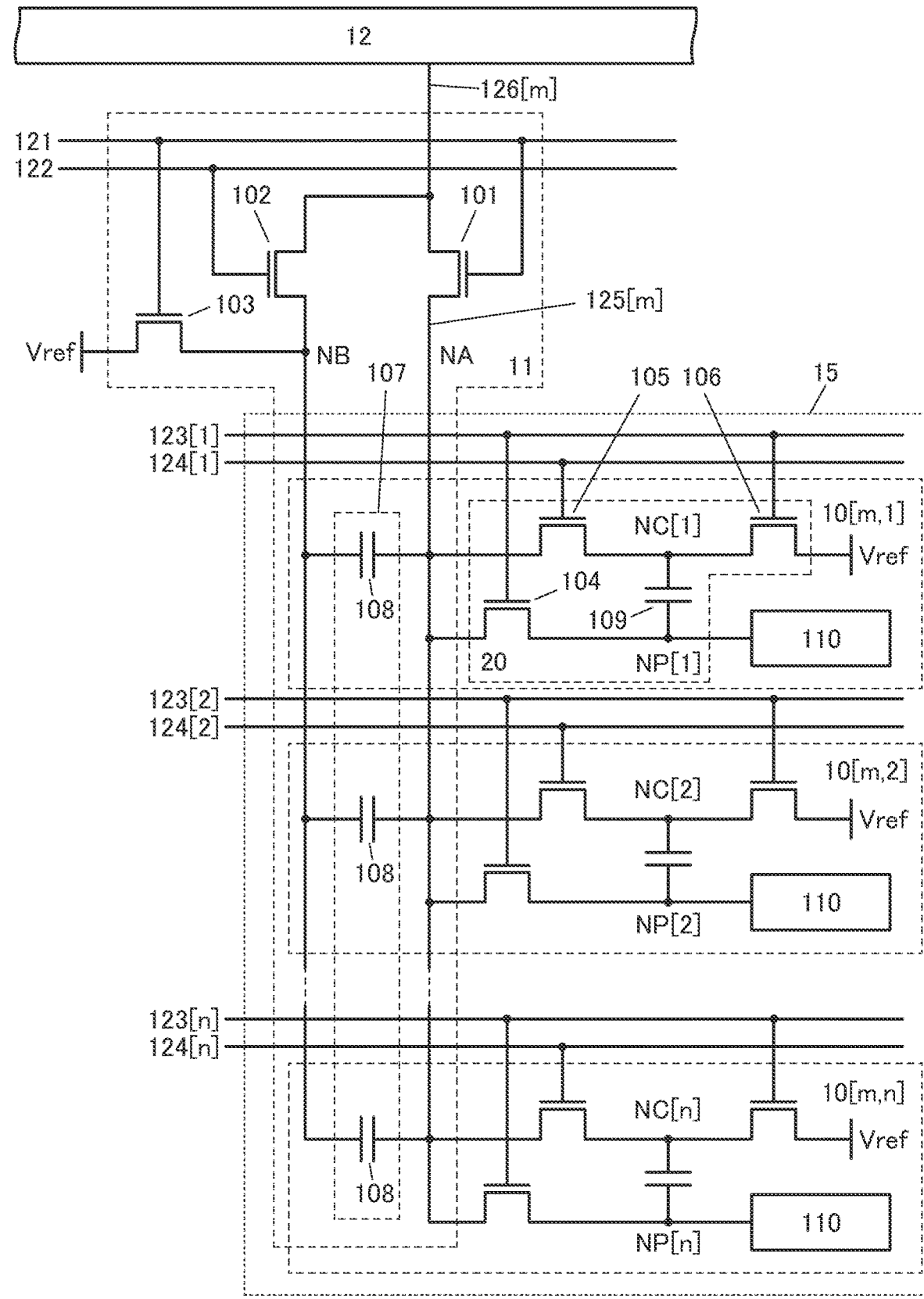
FIG. 2 is a diagram illustrating an adder circuit and pixels.

FIG. 2 is a diagram illustrating the circuit 11 and the pixels 10 (pixels 10[m, 1] to 10[m, n] (m and n are each a natural number greater than or equal to 1)) that are arranged in a given column (the m-th column) of the display apparatus illustrated in FIG. 1.

The circuit 11 can have a structure including a transistor 101, a transistor 102, a transistor 103, and a capacitor 107. One of a source and a drain of the transistor 101 is electrically connected to one electrode of the capacitor 107. The other electrode of the capacitor 107 is electrically connected to one of a source and a drain of the transistor 102. The one of the source and the drain of the transistor 102 is electrically connected to one electrode of the transistor 103.

Here, the capacitor 107 can consist of a plurality of capacitors 108 connected in parallel. When the capacitors 108 are separately provided in pixel regions, the total area of the capacitor 107 can be easily increased. Furthermore, the area occupied by the circuit 11 outside the display region can be reduced; thus, the frame can be narrowed. Note that some of the capacitors 108 may be provided outside the display region. The capacitors 108 are not necessarily provided in all pixel regions. By adjusting the number of capacitors 108 connected in parallel, the capacitor 107 can have a desired capacitance value.

The capacitors 108 can each include a wiring 125 as one electrode and another wiring overlapping with the wiring 125 as the other electrode. Thus, even when the capacitors 108 are arranged in pixel regions as illustrated in FIG. 2, the aperture ratio is not significantly decreased.

Each of the pixels 10 can have a structure including the circuit 20 and the circuit block 110. Furthermore, the capacitors 108 can be arranged in the pixel regions as described above.

The circuit 20 can have a structure including a transistor 104, a transistor 105, a transistor 106, and a capacitor 109. One of a source and a drain of the transistor 104 is electrically connected to one electrode of the capacitor 109. The other electrode of the capacitor 109 is electrically connected to one of a source and a drain of the transistor 105. The one of the source and the drain of the transistor 105 is electrically connected to one of a source and a drain of the transistor 106. The one of the source and the drain of the transistor 104 is electrically connected to the circuit block 110.

The circuit block 110 can have a structure including a transistor, a capacitor, a display device, and the like and will be described in detail later.

Connections between the components of the circuit 11 and the pixels 10 and a variety of wirings are described. A gate of the transistor 101 is electrically connected to a wiring 121. A gate of the transistor 102 is electrically connected to a wiring 122. Agate of the transistor 103 is electrically connected to the wiring 121. A gate of the transistor 104 is electrically connected to a wiring 123. A gate of the transistor 105 is electrically connected to a wiring 124. A gate of the transistor 106 is electrically connected to the wiring 123.

The one of the source and the drain of the transistor 101 is electrically connected to the wiring 125. The other of the source and the drain of the transistor 101 and the other of the source and the drain of the transistor 102 are electrically connected to a wiring 126. The other of a source and a drain of the transistor 103 and the other of the source and the drain of the transistor 106 are electrically connected to a wiring capable of supplying $V_{ref}$ (e.g., a reference potential such as 0 V).

The wirings 121, 122, and 123 (123[1] to 123[n]) and the wirings 124 (124[1] to 124[n]) each have a function of a gate line. For example, the wirings 121 and 122 can be electrically connected to a circuit for controlling an operation of the circuit 11. The wirings 123 and 124 can be electrically connected to the gate driver 13. The wiring 126 can be electrically connected to the source driver 12 (see FIG. 1).

Here, a wiring (wiring 125) connecting the one of the source and the drain of the transistor 101, the one electrode of the capacitor 107, and the one of the source and the drain of the transistor 105 is referred to a node NA. A wiring connecting the one of the source and the drain of the transistor 102, the one of the source and the drain of the transistor 103, and the other electrode of the capacitor 107 is referred to as a node NB. A wiring connecting the one of the source and the drain of the transistor 105, the one of the source and the drain of the transistor 106, and the other electrode of the capacitor 109 is referred to as a node NC. A wiring connecting the one of the source and the drain of the transistor 104, the one electrode of the capacitor 109, and the circuit block 110 is referred to as a node NP.

The node NP can be floating, and the display device included in the circuit block 110 operates in accordance with the potential of the node NP.

In the circuit 11, first, the first data (weight: W) is written to the node NA. At this time, "$V_{ref}$" is supplied to the other electrode of the capacitor 107, and the capacitor 107 is made to retain "$W-V_{ref}$". Next, the node NA is set to be floating and the second data (data: D) is supplied to the node NB.

At this time, when the capacitance value of the capacitor 107 is $C_{107}$ and the capacitance value of the node NA is $C_{NA}$, the potential of the node NA becomes $W+(C_{107}/(C_{107}+C_{NA}))\times(D-V_{ref})$. Here, when the value of $C_{107}$ is made large and the value of $C_{NA}$ can be negligible, the potential of the node NA becomes "$W+D-V_{ref}$". In one embodiment of the present invention, it is easy to increase the total area of the capacitor 107 to increase the capacitance value ($C_{107}$) as described above, so that data addition can be performed efficiently.

Therefore, when "W"="D", "$V_{ref}$"=0 V, and $C_{107}$ is sufficiently larger than $C_{NA}$, the potential of the node NA becomes closer to "2D". In other words, the third data ("2D"), which is a potential approximately twice the output of the source driver 12, can be supplied to the node NA.

In each of the pixels 10, when the first data "W" is written to the node NA, "W" is written to the node NP. At this time, "$V_{ref}$" is supplied to the other electrode of the capacitor 109, and the capacitor 109 is made to retain "$W-V_{ref}$". Next, the node NP is set to be floating and the third data ("2D") is supplied to the node NC.

At this time, when the capacitance value of the capacitor 109 is $C_{109}$ and the capacitance value of the node NP is $C_{NP}$, the potential of the node NP becomes $W+(C_{109}/(C_{109}+C_{NP}))\times(2D-V_{ref})$. Here, when the value of $C_{109}$ is made large and the value of $C_{NP}$ can be negligible, the potential of the node NP becomes "$W+2D-V_{ref}$".

Therefore, when "W"="D", "$V_{ref}$"=0 V, and $C_{109}$ is sufficiently larger than $C_{NP}$, the potential of the node NP becomes closer to "D+2D"="3D". In other words, the fourth data ("3D"), which is a potential approximately three times the output of the source driver 12, can be supplied to the node NP.

The operation of the pixels 10 can be different from that described above. When the third data "2D" is written to the node NA, "2D" is written to the node NP. At this time, "$V_{ref}$" is supplied to the other electrode of the capacitor 109, and the capacitor 109 is made to retain "$2D-V_{ref}$". Then, the node NP is set to be floating and the third data ("2D") is supplied to the node NC.

At this time, when the capacitance value of the capacitor 109 is $C_{109}$ and the capacitance value of the node NP is $C_{NP}$, the potential of the node NP becomes $2D+(C_{109}/(C_{109}+C_{NP}))\times(2D-V_{ref})$. Here, when the value of $C_{109}$ is made large and the value of $C_{NP}$ can be negligible, the potential of the node NP becomes "$2D+2D-V_{ref}$".

Therefore, when "W"="D", "$V_{ref}$"=0 V, and $C_{109}$ is sufficiently larger than $C_{NP}$, the potential of the node NP becomes closer to "2D+2D"="4D". In other words, the fourth data ("4D"), which is a potential approximately four times the output of the source driver 12, can be supplied to the node NP.

By such an action, a high voltage can be generated even using a general-purpose driver IC. For example, a liquid crystal device that requires a high voltage for gray level control can be driven. Alternatively, since a voltage that is supplied from the source driver 12 in order to drive a general liquid crystal device or light-emitting device can be reduced to approximately ⅓ to ¼, the power consumption of the display apparatus can be reduced.

Furthermore, correction data may be supplied as the first data (weight: W). For example, when luminance correction data is added to image data, variation in the luminance unique to the display apparatus can be corrected. Alternatively, correction data may be used for HDR display because the luminance can be corrected pixel by pixel. In the case where a light-emitting device is used as the display device, the display quality is affected by variation in the threshold voltage of a driving transistor; thus, the display quality may be improved by supplying, as the first data (weight: W), threshold-voltage correction data for the transistor. Note that the first data (weight: W) and the second data (data: D) may be interchanged.

In one embodiment of the present invention, a data potential generated in the circuit 11 as described above is supplied to a specific pixel 10 to determine the potential of the node NP. Such an operation is performed in the pixel 10[m, 1] to the pixel 10[m, n] successively, whereby the potential of the node NP of each of the pixels 10 can be determined. That is, different image data can be supplied to the pixels 10.

The node NA, the node NB, the node NC, and the node NP function as storage nodes. When the transistor connected to the corresponding node is brought into conduction, data can be written to the node. When the transistor is brought into non-conduction, the data can be retained in the node. The use of a transistor with an extremely low off-state current as the transistor enables a leakage current to be reduced and the potential of the node to be retained for a long time. As the transistor, a transistor using a metal oxide in a channel formation region (hereinafter referred to as an OS transistor) can be used, for example.

Specifically, OS transistors are preferably used as any or all of the transistors 101, 102, 103, 104, 105, and 106. An OS transistor may also be used for a component included in the circuit block 110. In the case of operating within a range where the amount of leakage current is acceptable, a transistor containing Si in a channel formation region (hereinafter, Si transistor) may be used. Alternatively, an OS transistor and a Si transistor may be used together. Examples of the Si transistor include a transistor containing amorphous silicon and a transistor containing crystalline silicon (microcrystalline silicon, low-temperature polysilicon, or single crystal silicon).

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yA/μm (current per micrometer of a channel width). An OS transistor has features such that impact ionization, an avalanche breakdown, a short-channel effect, or the like does not occur, which are different from those of a Si transistor. Thus, the use of an OS transistor enables formation of a highly reliable circuit. Moreover, variations in electrical characteristics due to crystallinity unevenness, which are caused in Si transistors, are less likely to occur in OS transistors.

A semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, it is preferable that the atomic ratio of metal elements in a sputtering target used to form a film of the In-M-Zn oxide satisfy In M and Zn M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of metal elements in the sputtering target in a range of ±40%.

An oxide semiconductor with low carrier density is used for the semiconductor layer. For example, the semiconductor layer may use an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low density of defect states and can thus be regarded as having stable characteristics.

Note that, without limitation to these, a material with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When the oxide semiconductor in the semiconductor layer contains silicon or carbon, which is an element belonging to Group 14, the amount of oxygen vacancies is increased in the semiconductor layer, and the semiconductor layer becomes n-type. Thus, the concentration of silicon or carbon (the concentration obtained by secondary ion mass spectrometry) in the semiconductor layer is set to $2\times10^{18}$ atoms/cm$^3$ or lower, preferably $2\times10^{17}$ atoms/cm$^3$ or lower.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to $1\times10^{18}$ atoms/cm$^3$ or lower, preferably $2\times10^{16}$ atoms/cm$^3$ or lower.

When the oxide semiconductor in the semiconductor layer contains nitrogen, electrons functioning as carriers are generated and the carrier density increases, so that the semiconductor layer easily becomes n-type. Thus, a transistor using an oxide semiconductor that contains nitrogen is likely to be normally on. Hence, the concentration of nitrogen in the semiconductor layer (the concentration obtained by secondary ion mass spectrometry) is preferably set to $5\times10^{18}$ atoms/cm$^3$ or lower.

When hydrogen is contained in an oxide semiconductor included in the semiconductor layer, hydrogen reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor obtained by secondary ion mass spectrometry (SIMS: Secondary Ion Mass Spectrometry) is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The semiconductor layer may have a non-single-crystal structure, for example. Examples of a non-single-crystal structure include a CAAC-OS (C-Axis Aligned Crystalline Oxide Semiconductor) including a c-axis aligned crystal, a polycrystalline structure, a microcrystalline structure, and an amorphous structure. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

The composition of a CAC (Cloud-Aligned Composite)-OS, which is one embodiment of a non-single-crystal semiconductor layer, is described below.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, when the atomic ratio of In to an element M in a first region is greater than the atomic ratio of In to an element M in a second region, for example, the first region is described as having higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible; for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a $\theta/2\theta$ scan by an out-of-plane method, which is an X-ray diffraction (XRD) measurement method. That is, it is found by the XRD measurement that there are no alignment in the a-b plane direction and no alignment in the c-axis direction in the measured areas.

In an electron diffraction pattern of the CAC-OS that is obtained by irradiation with an electron beam with a probe diameter of 1 nm (also referred to as a nanometer-sized electron beam), a ring-like region (ring region) with high luminance and a plurality of bright spots in the ring region are observed. Thus, it is found from the electron diffraction pattern that the crystal structure of the CAC-OS includes an nc (nano-crystal) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region containing $GaO_{X3}$ as a main component and the region containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the region containing $In_{X2}Zn_{Y2}O_{Z2}$ or $InO_{X1}$ as a main component, the conductivity of an oxide semiconductor is generated. Accordingly, when the regions containing $In_{X2}Zn_{Y2}O_{Z2}$ or $InO_{X1}$ as a main component are distributed like a cloud in an oxide semiconductor, high field-effect mobility ($\mu$) can be achieved.

By contrast, the insulating property of the region containing $GaO_{X3}$ or the like as a main component is superior to that of the region containing $In_{X2}Zn_{Y2}O_{Z2}$ or $InO_{X1}$ as a main component. In other words, when the regions containing $GaO_{X3}$ or the like as a main component are distributed in an oxide semiconductor, leakage current can be suppressed and a favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and a high field-effect mobility ($\mu$) can be achieved.

A semiconductor element using a CAC-OS has high reliability. Thus, the CAC-OS is suitably used as a material in a variety of semiconductor devices.

Figure 3A:
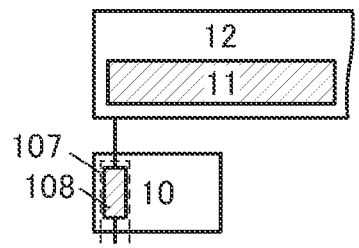
FIG. 3(A) to FIG. 3(F) are diagrams illustrating adder circuits and pixels.

Note that in the display apparatus of one embodiment of the present invention, the components of the circuit 11 other than the capacitor 107 may be incorporated in the source driver 12 as illustrated in FIG. 3(A). This structure enables a narrow frame.

When pixel circuits and the source driver 12 are monolithically formed over a substrate, a stack structure including a region where the source driver 12 and any of the components of the circuit 11 overlap with each other may be employed. This structure can improve the component design flexibility and electrical characteristics of the circuit 11.

Figure 3B:
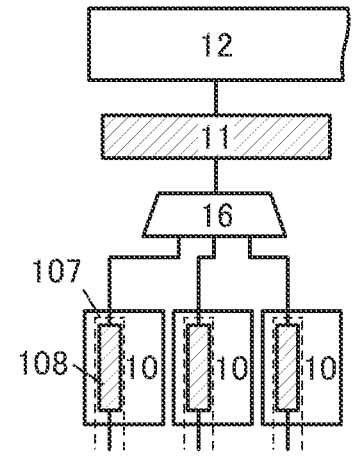

Although FIG. 1 illustrates the example in which the circuit 11 is provided for each column, a selection circuit 16 may be provided between the circuit 11 and the pixels 10 and one circuit 11 may perform data writing on pixels in a plurality of columns, as illustrated in FIG. 3(B). With such a structure, the number of circuits 11 can be reduced, and the frame can be narrowed. Although FIG. 3(B) illustrates an example in which a combination of one circuit 11 and one selection circuit 16 performs data writing on pixels in three columns, it is not limited thereto and the number of columns is determined in the range of allowable writing time.

Figure 3C:
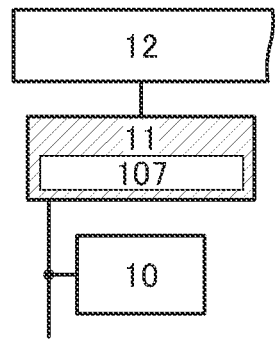

Alternatively, the capacitor 107 may be provided not in the display region but outside the display region with the circuit 11, as illustrated in FIG. 3(C). In this structure, a stack structure including a region where the circuit 11 and the capacitor 107 overlap with each other may be employed. Such a structure can increase the aperture ratio of the pixel 10.

Figure 3D:
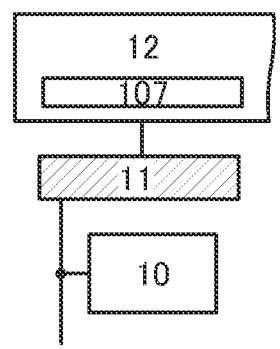

Alternatively, the capacitor 107 may be incorporated in the source driver 12, as illustrated in FIG. 3(D). In this structure, a stack structure including a region where the source driver 12 and the capacitor 107 overlap with each other may be employed. Such a structure enables a narrow frame.

Figure 3E:
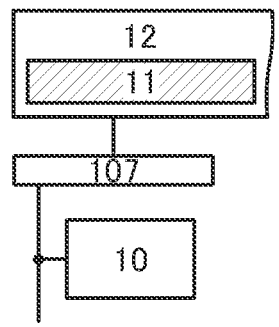

Alternatively, a structure may be employed in which the capacitor 107 is positioned outside the display region and the circuit 11 is incorporated in the source driver 12, as illustrated in FIG. 3(E). In this structure, a stack structure including a region where the source driver 12 and the circuit 11 overlap with each other may be employed. Such a structure can narrow a frame and increase the aperture ratio of the pixel.

Figure 3F:
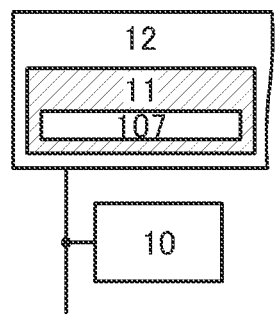

Alternatively, the circuit 11 and the capacitor 107 may be incorporated in the source driver 12, as illustrated in FIG. 3(F). In this structure, a stack structure including a region where the source driver 12 and the circuit 11 or the capacitor 107 overlap with each other may be employed. Alternatively, a stack structure including a region where the source driver 12, the circuit 11, and the capacitor 107 overlap with one another may be employed. Such a structure enables a narrow frame.

Since the transistors 101, 102, and 103 included in the circuit 11 are provided outside the display region, the size is less likely to be limited and the channel width thereof can be larger than that of the transistor provided in the pixel. The use of a transistor with a large channel width makes it possible to shorten the charge and discharge time for the wiring 125 or the like and to facilitate an increase in the frame frequency. Furthermore, such a transistor can be easily used in a high-resolution display including a large number of pixels with a short horizontal period.

When OS transistors are used as the transistors 101, 102, and 103, the circuit 11 can withstand a high voltage, and a stable operation can be performed even when a voltage generated in data addition is several tens of volts. In the case where the transistors 101, 102, and 103 are Si transistors provided in an IC chip, a higher-speed operation can be performed. In the case where the transistors 101, 102, and 103 are provided in an IC chip, the transistors may be OS transistors.

Figure 4:
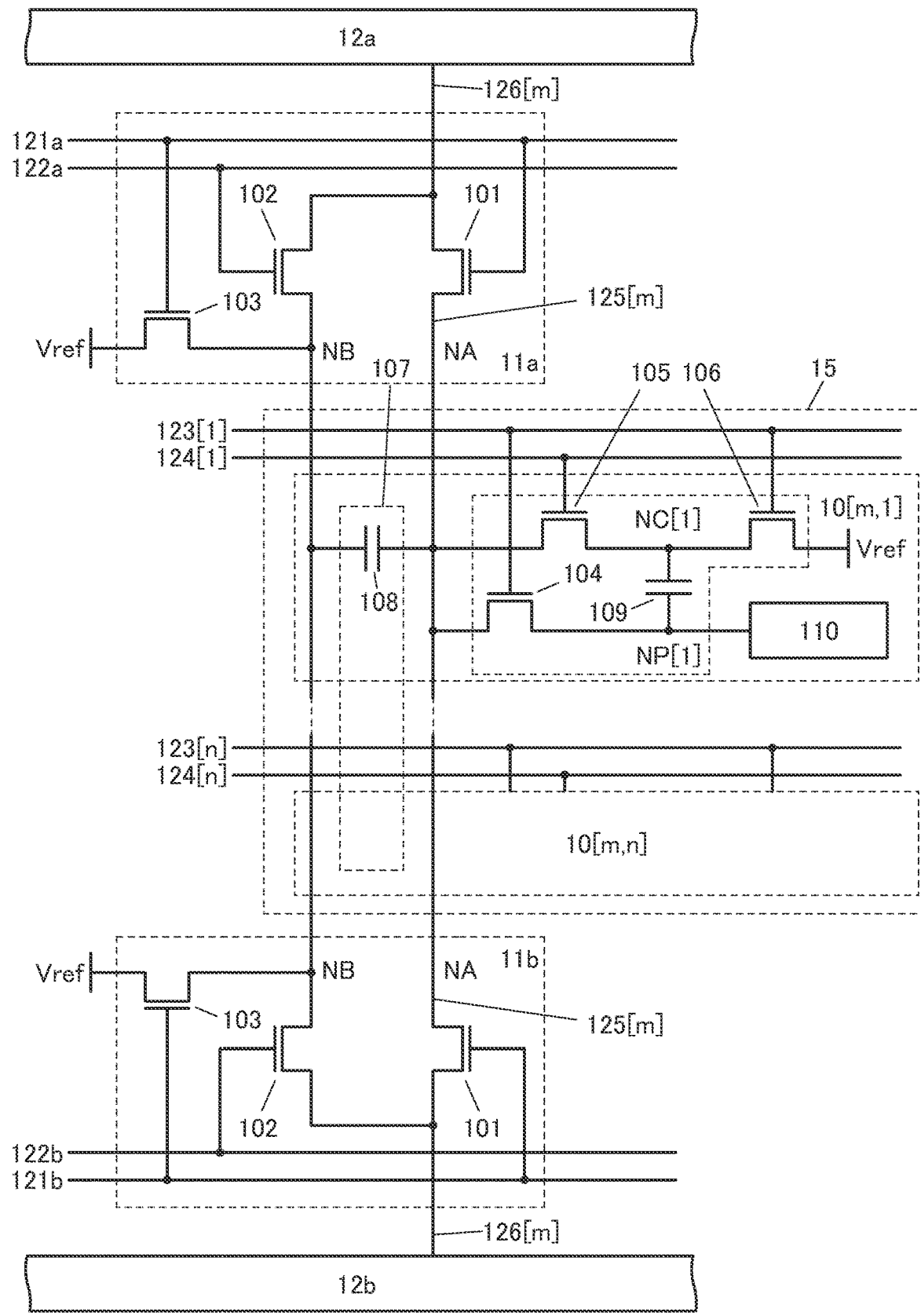
FIG. 4 is a diagram illustrating adder circuits and pixels.

As illustrated in FIG. 4, the circuit 11 may be provided in both a region along one side of the display region 15 and a region along a side opposite to the one side.

Here, the circuit 11 provided along one side of the display region 15 is a circuit 11a. An operation of the circuit 11a is controlled by signals supplied from wirings 121a and 122a. The circuit 11a is electrically connected to a source driver 12a. The circuit 11 provided along the side opposite to the one side of the display region 15 is a circuit 11b. An operation of the circuit 11b is controlled by signals supplied from wirings 121b and 122b. The circuit 11b is electrically connected to a source driver 12b.

The circuit 11a and the circuit 11b operate to output the same data at the same timing. That is, the same data is output from the source drivers 12a and 12b at the same timing, and the same operation signals are supplied to the wiring 121a and the wiring 121b, or the wiring 122a and the wiring 122b at the same timing.

By such an operation, the circuit 11a and the circuit 11b can operate at the same time and the same data can be output to the wiring 125. Thus, the wiring 125 can be charged and discharged at high speed, and a display apparatus including a large number of pixels with a short horizontal period, a large-sized display apparatus including the wiring 125 with high parasitic capacitance, or the like can be easily achieved.

Figure 5:
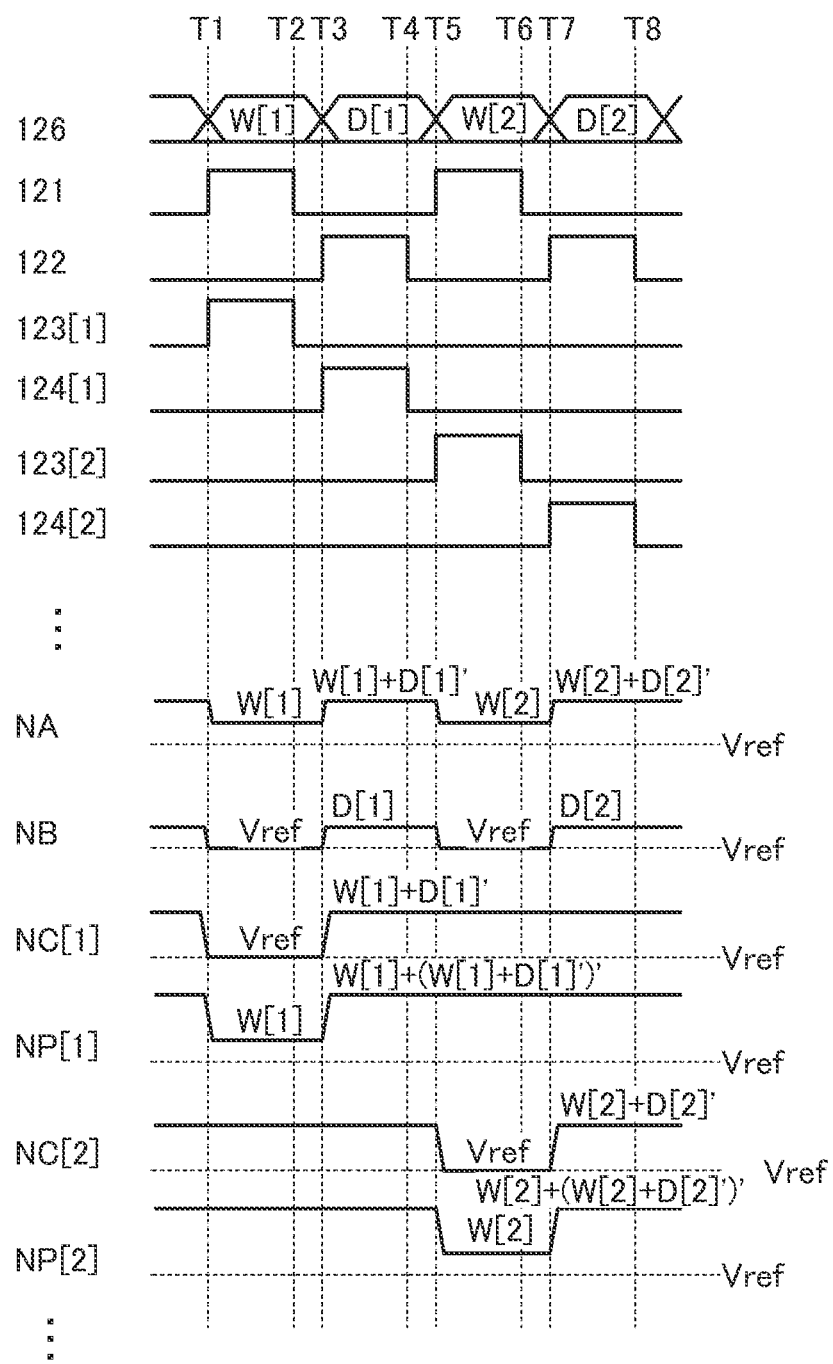
FIG. 5 is a timing chart showing operations of an adder circuit and pixels.

Next, a method for supplying a data potential, which is approximately three times a data potential output from the source driver, to the display device by operations of the circuit 11 and the pixel 10 will be described with reference to a timing chart in FIG. 5.

Note that in the following description, a high potential is represented by "H" and a low potential is represented by "L". In addition, weight supplied to a pixel 10[1] is "W[1]", image data supplied to the pixel 10[1] is "D[1]", weight supplied to a pixel 10[2] is "W[2]", and image data supplied to the pixel 10[2] is "D[2]". As "$V_{ref}$", 0 V, a GND potential, or a certain reference potential can be used, for example.

Note that in potential distribution, potential coupling, or potential loss, detailed changes due to a circuit configuration, operation timing, or the like are not considered. In addition, a potential change due to capacitive coupling using the capacitor depends on the capacitance ratio of the capacitor to a component connected to the capacitor; however, for clarity of description, the capacitance value of the component is assumed to be sufficiently small.

At Time T1, "W[1]" is supplied to the wiring 126, the potential of the wiring 121 is set to "H", the potential of the wiring 122 is set to "L", the potential of 123[1] is set to "H", and the potential of the wiring 124[1] is set to "L", whereby the transistor 103 is brought into conduction and the potential of the node NB becomes "$V_{ref}$". This operation is a reset operation for an addition operation (capacitive coupling operation) to be performed later.

Furthermore, the transistors 101 and 104 are brought into conduction, and the potential of the wiring 126 is written to the node NA. In addition, the potential of the node NA is written to the node NP[1]. This operation is a weight writing operation in both the circuit 11 and the pixel 10, and the potentials of the node NA and the node NP[1] become "W[1]".

At Time T2, the potential of the wiring 121 is set to "L", the potential of the wiring 122 is set to "L", the potential of the wiring 123[1] is set to "L", and the potential of the wiring 124[1] is set to "L", whereby the transistors 101, 103, and 104 are brought into non-conduction. At this time, "W[1]" is retained in the node NA and the node NP[1]. In addition, "W[1]−$V_{ref}$" is retained in the capacitor 107 and the capacitor 109.

At Time T3, "D[1]" is supplied to the wiring 126, the potential of the wiring 121 is set to "L", the potential of the wiring 122 is set to "H", the potential of 123[1] is set to "L", and the potential of 124[1] is set to "H", whereby the transistor 102 is brought into conduction. At this time, the potential of the node NB becomes "D[1]", and "D[1]'" corresponding to the capacitance ratio of the node NB to the node NA is added to the node NA. This operation is an addition operation in the circuit 11, and the potential of the node NA becomes "W[1]+(D[1]−$V_{ref}$)'". When "$V_{ref}$"=0 at this time, the potential of the node NA becomes "W[1]+D[1]'".

In the pixel 10, the transistor 105 is brought into conduction. At this time, the potential of the node NC becomes "W[1]+D[1]'", and "(W[1]+D[1]')'" corresponding to the capacitance ratio of the node NC[1] to the node NP[1] is added to the node NP[1]. This operation is an addition operation in the pixel 10, and the potential of the node NP[1] becomes "W[1]+(W[1]+D[1]'−$V_{ref}$)'". When "$V_{ref}$"=0 at this time, the potential of the node NP[1] becomes "W[1]+(W[1]+D[1]')'". The potential of the node NP[1] is supplied to the display device, and an image is displayed.

In the case where W[1]=D[1], the capacitance of the node NA is sufficiently smaller than the capacitance of the node NB, and the capacitance of the node NP[1] is sufficiently smaller than the capacitance of the node NC[1], "W[1]+(W[1]+D[1]')'" becomes a value close to "3D[1]". Thus, a data potential approximately three times the data potential output from the source driver can be supplied to the display device.

At Time T4, the potentials of the wirings 121, 122, 123[1], and 124[1] are set to "L", whereby the transistors 102 and 105 are brought into conduction, the potential of the node NP[1] is retained, and an image is displayed until an operation of the next frame. The above is the description of the operations of the pixel 10[1].

By applying the same operations to the pixel 10[2] from Time T5 to Time T8, the pixel 10 [2] can display an image in accordance with "W[2]+(W[2]+D[2]')'".

Figure 6:
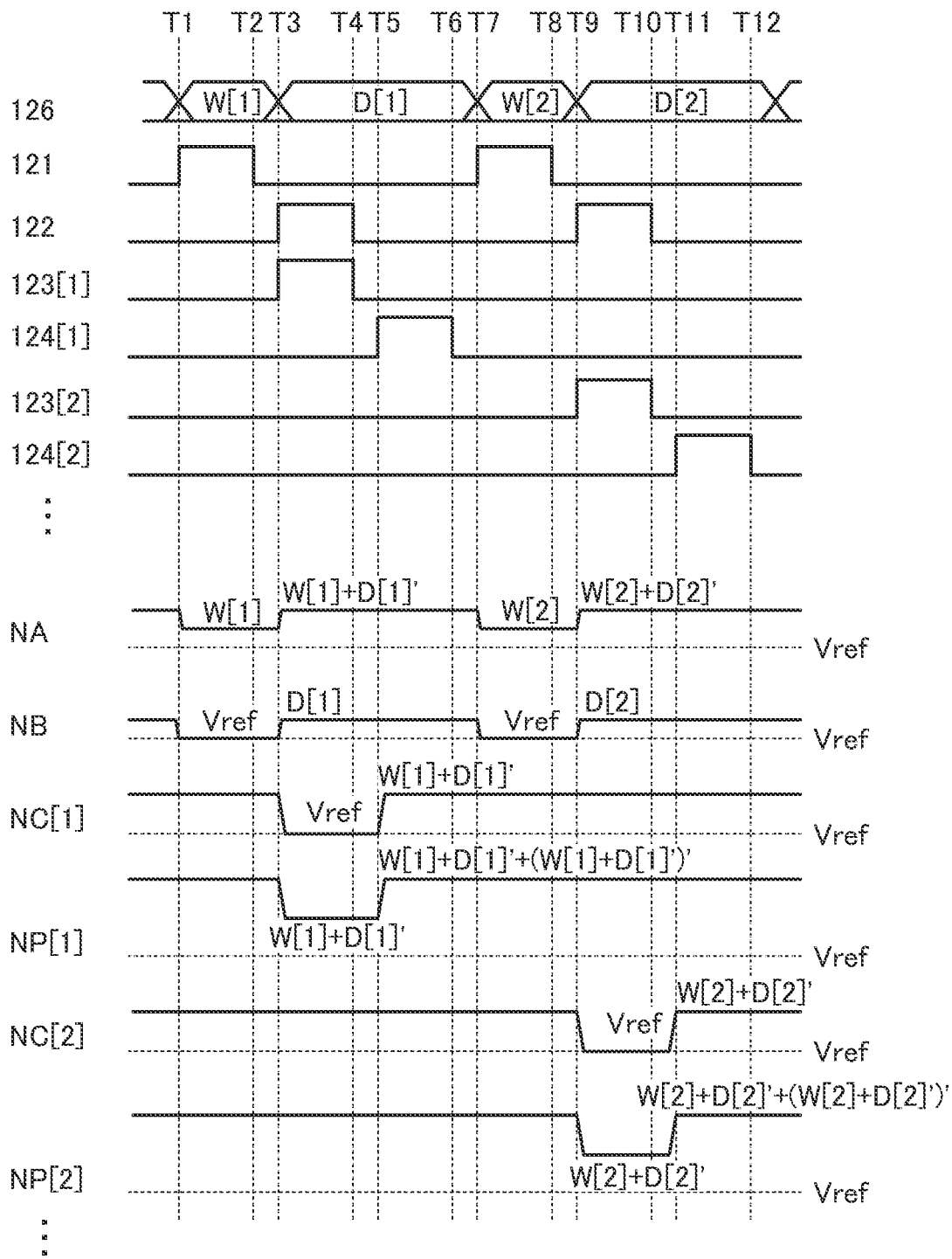
FIG. 6 is a timing chart showing operations of an adder circuit and pixels.

Next, a method for supplying a data potential, which is approximately four times a data potential output from the source driver, to the display device by operations of the circuit 11 and the pixel 10 will be described with reference to a timing chart in FIG. 6.

At Time T1, "W[1]" is supplied to the wiring 126, the potential of the wiring 121 is set to "H", the potential of the wiring 122 is set to "L", the potential of the wiring 123[1] is set to "L", and the potential of the wiring 124[1] is set to "L", whereby the transistor 103 is brought into conduction and the potential of the node NB becomes "$V_{ref}$". This operation is a reset operation for an addition operation (capacitive coupling operation) to be performed later.

At Time T2, the potential of the wiring 121 is set to "L", the potential of the wiring 122 is set to "L", the potential of the wiring 123[1] is set to "L", and the potential of the wiring 124[1] is set to "L", whereby the transistors 101 and 103 are brought into non-conduction. At this time, "W[1]" is retained in the node NA. In addition, "W[1]−$V_{ref}$" is retained in the capacitor 107. This operation is a weight writing operation in the circuit 11.

At Time T3, "D[1]" is supplied to the wiring 126, the potential of the wiring 121 is set to "L", the potential of the wiring 122 is set to "H", the potential of 123[1] is set to "H", and the potential of 124[1] is set to "L", whereby the transistor 102 is brought into conduction. At this time, the potential of the node NB becomes "D[1]", and "D[1]'" corresponding to the capacitance ratio of the node NB to the node NA is added to the node NA. This operation is an addition operation in the circuit 11, and the potential of the node NA becomes "W[1]+(D[1]−$V_{ref}$)'". When "$V_{ref}$"=0 at this time, the potential of the node NA becomes "W[1]+D[1]'".

Furthermore, the transistors 104 and 106 are brought into conduction, and the potential of the node NA is written to the node NP[1]. In addition, "$V_{ref}$" is written to the node NC. This operation is a weight writing operation in the pixel 10 and a reset operation for capacitive coupling, and the potential of the node NP[1] becomes "W[1]+D[1]'".

At Time T4, the potential of the wiring 121 is set to "L", the potential of the wiring 122 is set to "L", the potential of 123[1] is set to "L", and the potential of 124[1] is set to "L", whereby the transistors 102, 104, and 106 are brought into non-conduction and "W[1]+D[1]'" is retained in the node NP[1].

At Time T5, the potential of the wiring 121 is set to "L", the potential of the wiring 122 is set to "L", the potential of 123[1] is set to "L", and the potential of 124[1] is set to "H", whereby the transistor 105 is brought into conduction. At this time, "W[1]+D[1]'", which is the potential of the node NA, is written to the node NC[1], and "(W[1]+D[1]')'" corresponding to the capacitance ratio of the node NC[1] to the node NP[1] is added to the node NP[1].

This operation is an addition operation in the pixel 10, and the potential of the node NP[1] becomes "(W[1]+D[1]')'+(W[1]+D[1]'−$V_{ref}$)'". When "$V_{ref}$"=0 at this time, the potential of the node NP[1] becomes "W[1]+D[1]'+(W[1]+D[1]')'". The potential of the node NP[1] is supplied to the display device, and an image is displayed.

In the case where W[1]=D[1], the capacitance of the node NA is sufficiently smaller than the capacitance of the node NB, and the capacitance of the node NP[1] is sufficiently smaller than the capacitance of the node NC[1], "W[1]+D[1]'+(W[1]+D[1]')'" becomes a value close to "4D[1]". Thus, a data potential approximately four times the data potential output from the source driver can be supplied to the display device.

At Time T6, the potentials of the wirings 121, 122, 123[1], and 124[1] are set to "L", whereby the transistors 102 and 105 are brought into conduction, the potential of the node NP[1] is retained, and an image is displayed until an operation of the next frame. The above is the description of the operations of the pixel 10[1].

By applying the same operations to the pixel 10[2] from Time T7 to Time T12, the pixel 10[2] can display an image in accordance with "W[2]+D[2]'+(W[2]+D[2]')'".

FIGS. 7(A) to 7(C) each illustrate an example of a structure including a light-emitting device as the display device, which can be applied to the circuit block 110.

The structure illustrated in FIG. 7(A) includes a transistor 111, a capacitor 113, and a light-emitting device 114. One of a source and a drain of the transistor 111 is electrically connected to one electrode of the light-emitting device 114. The one electrode of the light-emitting device 114 is electrically connected to one electrode of the capacitor 113. The other electrode of the capacitor 113 is electrically connected to a gate of the transistor 111. The gate of the transistor 111 is electrically connected to the node NP.

The other of the source and the drain of the transistor 111 is electrically connected to a wiring 128. The other electrode of the light-emitting device 114 is electrically connected to a wiring 129. The wirings 128 and 129 have a function of supplying power. For example, the wiring 128 is capable of supplying a high potential power. The wiring 129 is capable of supplying a low potential power.

In the structure illustrated in FIG. 7(A), current flows through the light-emitting device 114 when the potential of the node NP becomes higher than or equal to the threshold voltage of the transistor 111. Therefore, light emission of the light-emitting device 114 is started in some cases at the time when the weight (W) is written to the node NP.

Alternatively, as illustrated in FIG. 7(B), one electrode of the light-emitting device 114 may be electrically connected to the wiring 128, and the other electrode of the light-emitting device 114 may be electrically connected to the transistor 111 and the other of the source and the drain. This structure can also be applied to other circuit blocks 110 each including the light-emitting device 114.

FIG. 7(C) is a structure in which a transistor 112 is added to the structure of FIG. 7(A). One of a source and a drain of the transistor 112 is electrically connected to the one of the source and the drain of the transistor 111. The other of the source and the drain of the transistor 112 is electrically connected to the one electrode of the light-emitting device 114. A gate of the transistor 112 is electrically connected to a wiring 127. The wiring 127 can have a function of a signal line that controls the conduction of the transistor 112.

In this structure, current flows through the light-emitting device 114 when the potential of the node NP is higher than or equal to the threshold voltage of the transistor 111 and the transistor 112 is brought into conduction. Thus, light emission of the light-emitting device 114 can be started at any time after the operation of adding the weight (W) and the data (D).

FIG. 7(D) is a structure in which a transistor 115 is added to the structure of FIG. 7(A). One of a source and a drain of the transistor 115 is electrically connected to the one of the source and the drain of the transistor 111. The other of the source and the drain of the transistor 115 is electrically connected to a wiring 131. A gate of the transistor 115 is electrically connected to a wiring 132. The wiring 132 can have a function of a signal line that controls the conduction of the transistor 115.

The wiring 131 can be electrically connected to a supply source of a certain potential such as a reference potential. When a certain potential is supplied from the wiring 131 to the one of the source and the drain of the transistor 111, write of image data can be stable. Furthermore, the timing of light emission of the light-emitting device 114 can be controlled.

In addition, the wiring 131 can be connected to a circuit 120 and can also have a function of a monitor line. The circuit 120 can have one or more of a function of the supply source of a certain potential, a function of obtaining electric characteristics of the transistor 111, and a function of generating correction data.

FIGS. 8(A) to 8(D) each illustrate an example of a structure including a liquid crystal device as the display device, which can be applied to the circuit block 110.

Figure 8A:
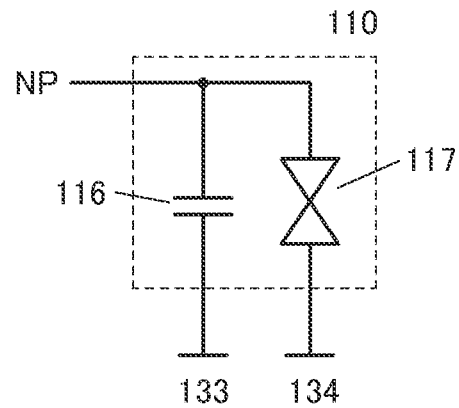
FIG. 8(A) to FIG. 8(D) are diagrams each illustrating a circuit block.

The structure illustrated in FIG. 8(A) includes a capacitor 116 and a liquid crystal device 117. One electrode of the liquid crystal device 117 is electrically connected to one electrode of the capacitor 116. The one electrode of the capacitor 116 is electrically connected to the node NP.

The other electrode of the capacitor 116 is electrically connected to a wiring 133. The other electrode of the liquid crystal device 117 is electrically connected to a wiring 134. The wirings 133 and 134 have a function of supplying power. The wirings 133 and 134 are capable of supplying a reference potential such as GND or 0 V or a given potential, for example.

Figure 8B:
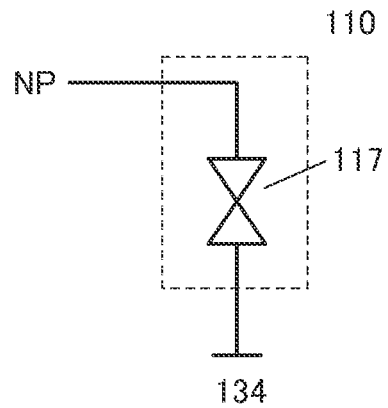

Note that a structure in which the capacitor 116 is omitted may be employed as illustrated in FIG. 8(B). As described above, an OS transistor can be used as the transistor connected to the node NP. Since an OS transistor has an extremely low leakage current, an image can be displayed for a comparatively long time even when the capacitor 116 functioning as a storage capacitor is omitted. In addition, regardless of the transistor structure, omitting the capacitor 116 is effective in the case where a high-speed operation allows a shorter display period as in field-sequential driving. The aperture ratio can be improved by omitting the capacitor 116. Alternatively, the transmittance of the pixel can be improved.

In the structures illustrated in FIGS. 8(A) and 8(B), the operation of the liquid crystal device 117 is started when the potential of the node NP is determined to be higher than or equal to the operation threshold of the liquid crystal device 117. Thus, a display operation is started in some cases at the time when the weight is written to the node NP, and the application might be limited. In a transmissive liquid crystal display apparatus, however, even when an unnecessary display operation is performed, visual recognition can be inhibited by performing an operation of turning off a backlight until the operation of adding the weight (W) and the data (D) is finished, for example.

Figure 8C:
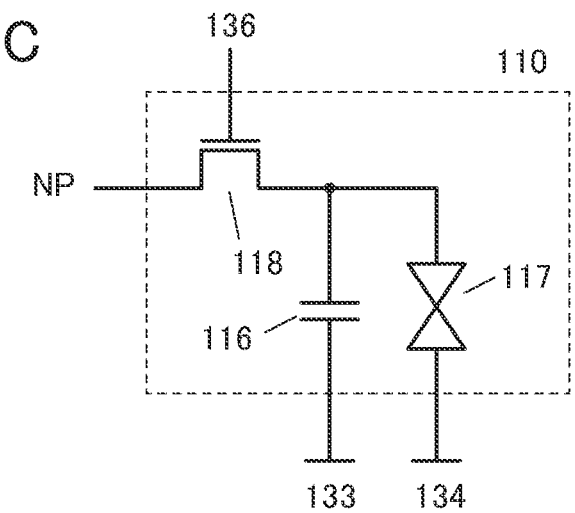

FIG. 8(C) illustrates a structure in which a transistor 118 is added to the structure of FIG. 8(A). One of a source and a drain of the transistor 118 is electrically connected to the one electrode of the capacitor 116. The other of the source and the drain of the transistor 118 is electrically connected to the node NP. A gate of the transistor 118 is electrically connected to a wiring 136. The wiring 136 can have a function of a signal line that controls the conduction of the transistor 118.

In this structure, the potential of the node NP is applied to the liquid crystal device 117 when the transistor 118 is brought into conduction. Thus, the operation of the liquid crystal device can be started at any time after the operation of adding the weight (W) and the data (D).

While the transistor 118 is in a non-conduction state, the potentials supplied to the capacitor 116 and the liquid crystal device 117 are retained continuously; thus, the potentials supplied to the capacitor 116 and the liquid crystal device 117 are preferably reset before image data is rewritten. For the reset, a reset potential is supplied to the wiring 125 to bring the transistor 104 and the transistor 118 into conduction at the same time, for example.

Figure 8D:
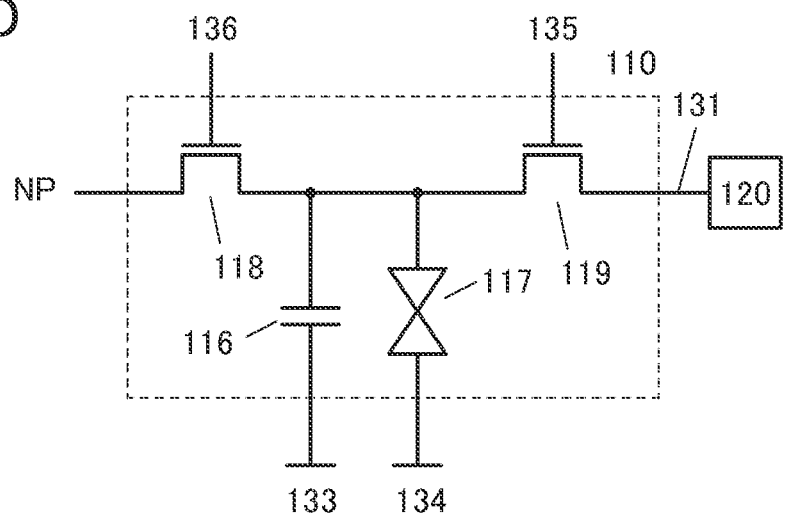

FIG. 8(D) illustrates a structure in which a transistor 119 is added to the structure of FIG. 8(C). One of a source and a drain of the transistor 119 is electrically connected to the one electrode of the liquid crystal device 117. The other of the source and the drain of the transistor 119 is electrically connected to the wiring 131. A gate of the transistor 119 is electrically connected to a wiring 135. The wiring 135 can have a function of a signal line that controls the conduction of the transistor 119.

The circuit 120 electrically connected to the wiring 131 is as described above using FIG. 7(D) and may have a function of resetting the potentials supplied to the capacitor 116 and the liquid crystal device 117.

Figure 9A:
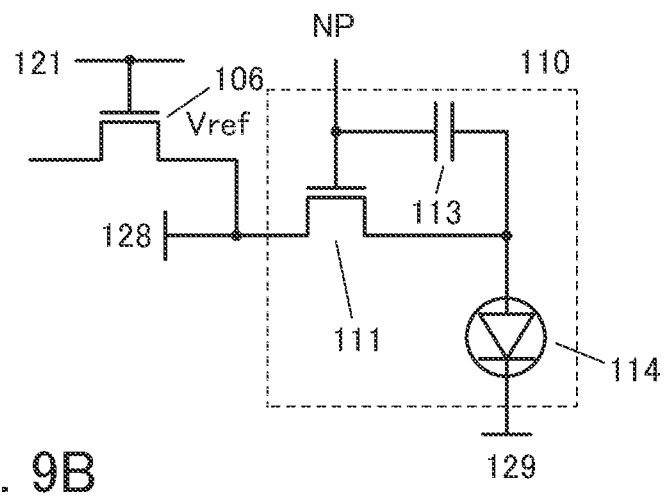
FIG. 9(A) to FIG. 9(C) are diagrams each illustrating a circuit block.
Figure 9B:
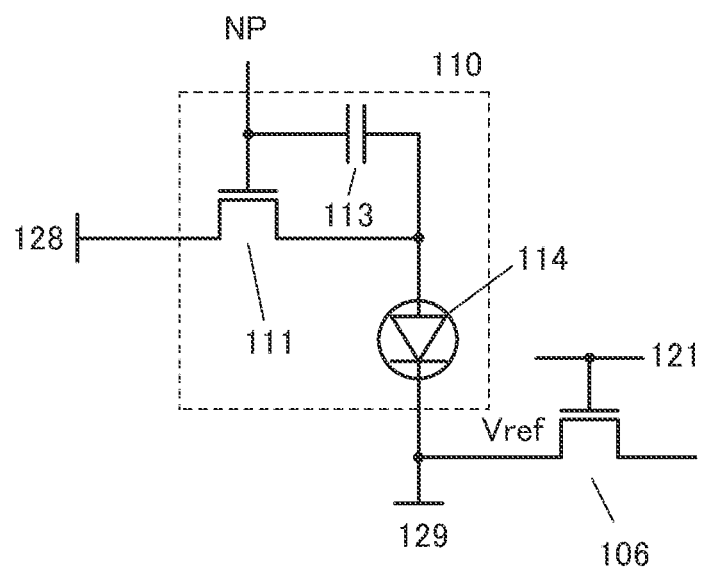
Figure 9C:
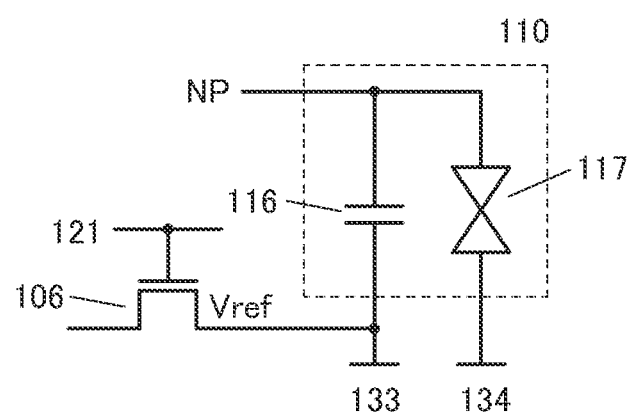

FIGS. 9(A) to 9(C) each illustrate a specific example of a wiring for supplying "$V_{ref}$" in the pixel 10 illustrated in FIG. 2 or the like. As illustrated in FIG. 9(A), the wiring 128 can be used as the wiring for supplying "$V_{ref}$" in the case where a light-emitting device is used as the display device. Since "$V_{ref}$" is preferably 0 V, GND, or a low potential, the wiring 128 also has a function of supplying at least any of these potentials. To the wiring 128, "$V_{ref}$" is supplied at the timing when data is written to the node NP, and a high potential power is supplied at the timing when the light-emitting device 114 emits light. Alternatively, as illustrated in FIG. 9(B), the wiring 129 that supplies a low potential may be used as the wiring for supplying "$V_{ref}$".

In the case where a liquid crystal device is used as the display device as illustrated in FIG. 9(C), the wiring 133 can be used as the wiring for supplying "$V_{ref}$". Alternatively, the wiring 134 may be used. Note that regardless of the kind of the display device, a dedicated common wiring for supplying "$V_{ref}$" may be provided.

Figure 10:
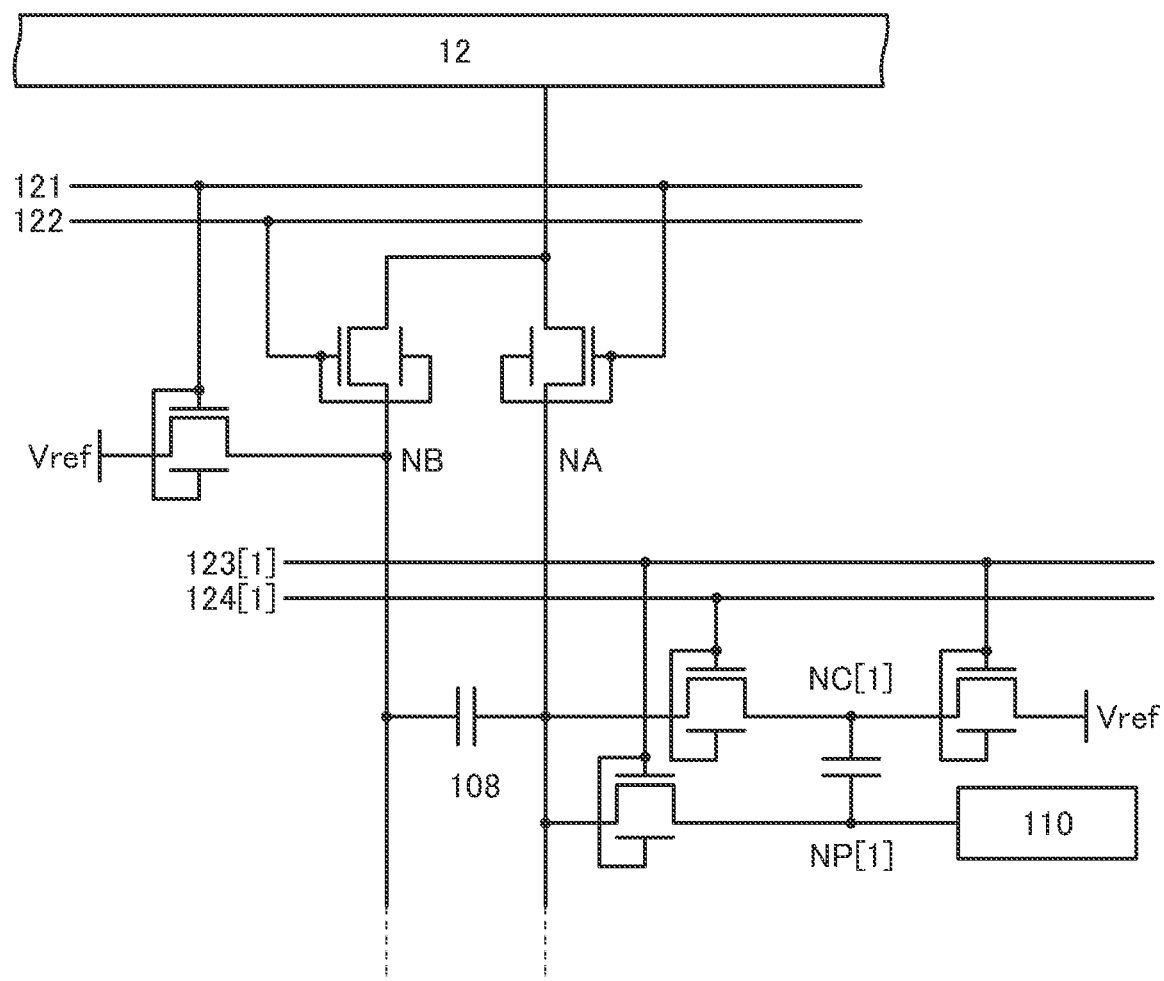
FIG. 10 is a diagram illustrating an adder circuit and a pixel.

In one embodiment of the present invention, as illustrated in an example of FIG. 10, a structure in which transistors are provided with back gates may be employed. FIG. 10 illustrates a structure in which back gates are electrically connected to front gates, which has an effect of increasing on-state currents. Alternatively, a structure in which the back gates are electrically connected to wirings capable of supplying a constant potential may be employed. This structure enables control of the threshold voltages of the transistors. The transistors included in the circuit block 110 may also have back gates.

Figure 11:
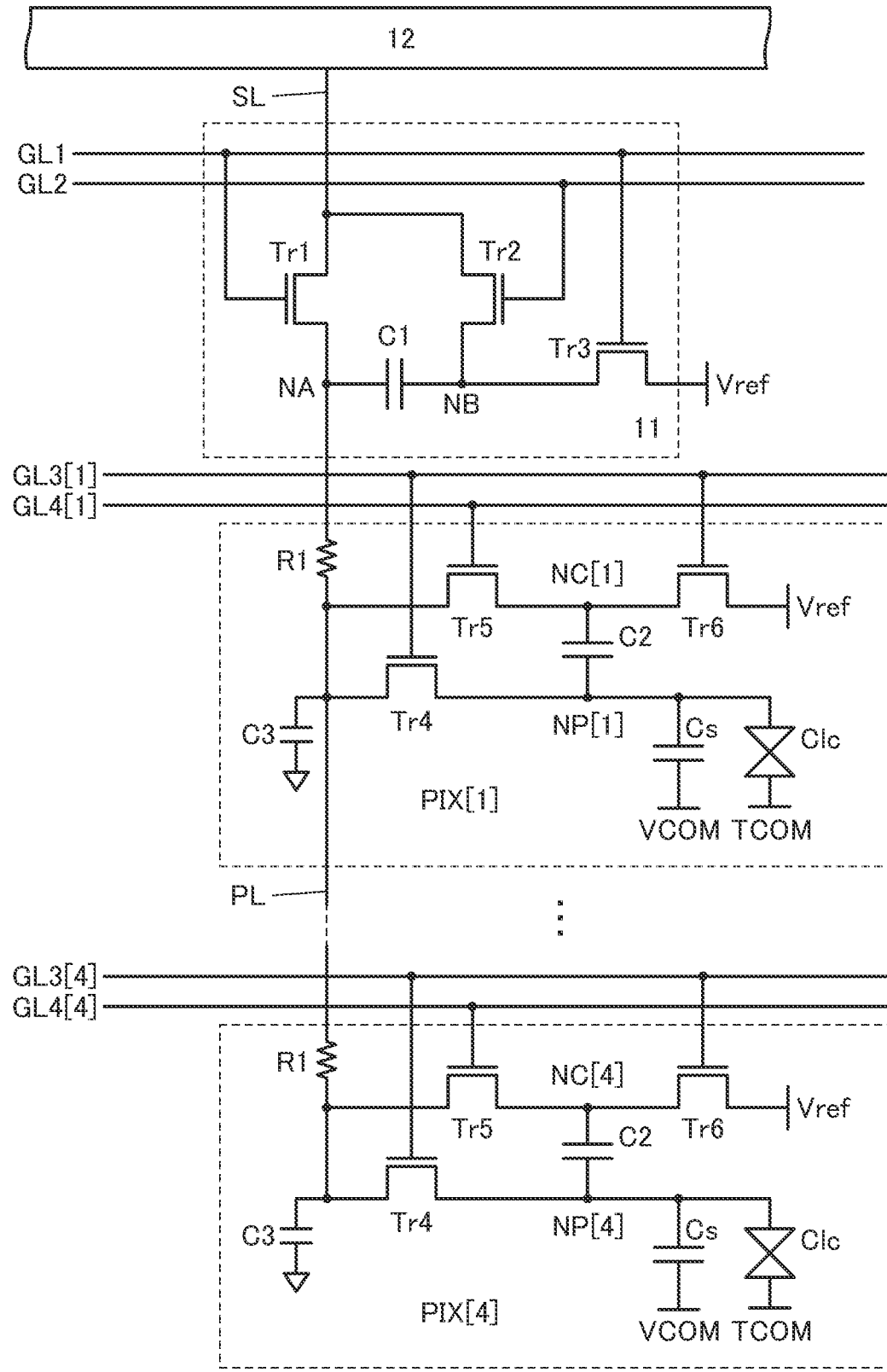
FIG. 11 is a diagram illustrating structures of an adder circuit and pixels used for simulation.

Next, simulation results of pixel operations are described. FIG. 11 illustrates a structure including pixels (PIX) and the circuit 11 used in the simulation. The number of pixels is assumed to be 4, and the circuit block 110 has the structure (the liquid crystal device and the capacitor) illustrated in FIG. 8(A). Performed was the simulation of voltage changes of the node NP in each pixel in the operation of making the input voltage approximately three times higher (hereinafter, operation 1) and the operation of making the input voltage approximately four times higher (hereinafter, hereinafter, operation 2).

Parameters used in the simulation of the operation 1 are as follows: the transistor sizes are L/W=3 μm/100 μm (transistors Tr1, Tr2, and Tr3) and L/W=3 μm/50 μm (transistors Tr4, Tr5, and Tr6)); the capacitance value of a capacitor C1 is 500 pF; the capacitance value of a capacitor C2 is 5 pF; the capacitance value of a capacitor Cs is 500 fF; and the capacitance value of a liquid crystal device Clc is 500 fF. In addition, voltages applied to gates of the transistors are +15 V as "H" and −15 V as "L".

Parameters used in the simulation of the operation 2 are as follows: the transistor sizes are L/W=1 μm/50 μm (the transistors Tr1, Tr2, and Tr3) and L/W=3 μm/100 μm (the transistors Tr4, Tr5, and Tr6)); the capacitance value of the capacitor C1 is 100 pF; the capacitance value of the capacitor C2 is 10 pF; the capacitance value of the capacitor Cs is 50 fF; and the capacitance value of the liquid crystal device Clc is 50 fF. In addition, voltages applied to the gates of the transistors are +15 V as "H" and −20 V as "L".

Note that it is preferable that as many resistors R1 corresponding to parasitic resistance and capacitors C3 corresponding to parasitic capacitance as the pixels be incorporated in a wiring PL connecting the circuit 11 and the pixels PIX to obtain more accurate simulation results. In this simulation, to verify the basic operations of the circuit 11 and the pixels PIX, the parasitic capacitance of the wiring PL (the sum of C3) is set to 0 F and the resistance of the wiring PL (the sum of R1) is set to 0Ω. Note that SPICE was used as circuit simulation software.

Figure 12:
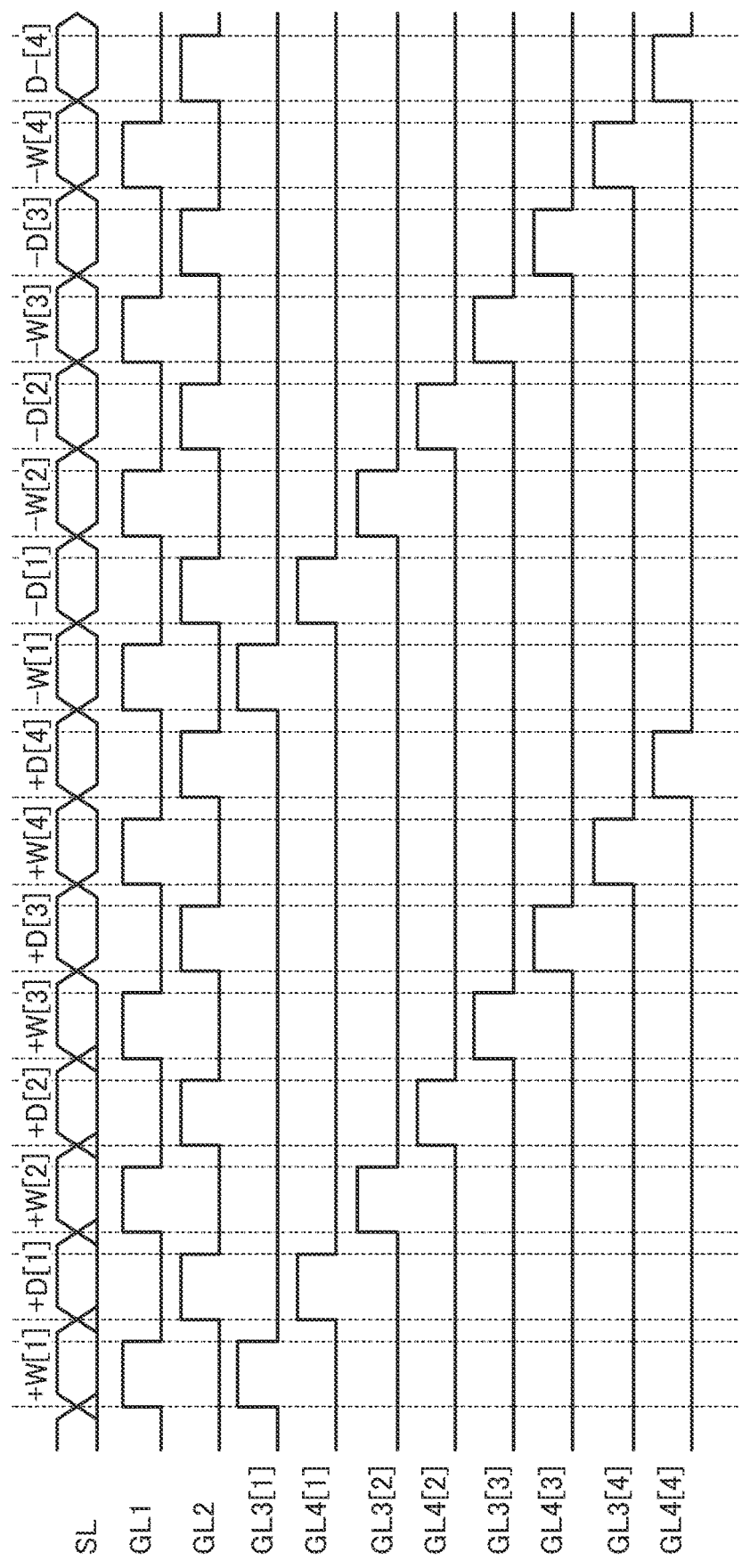
FIG. 12 is a timing chart used for simulation.
Figure 13:
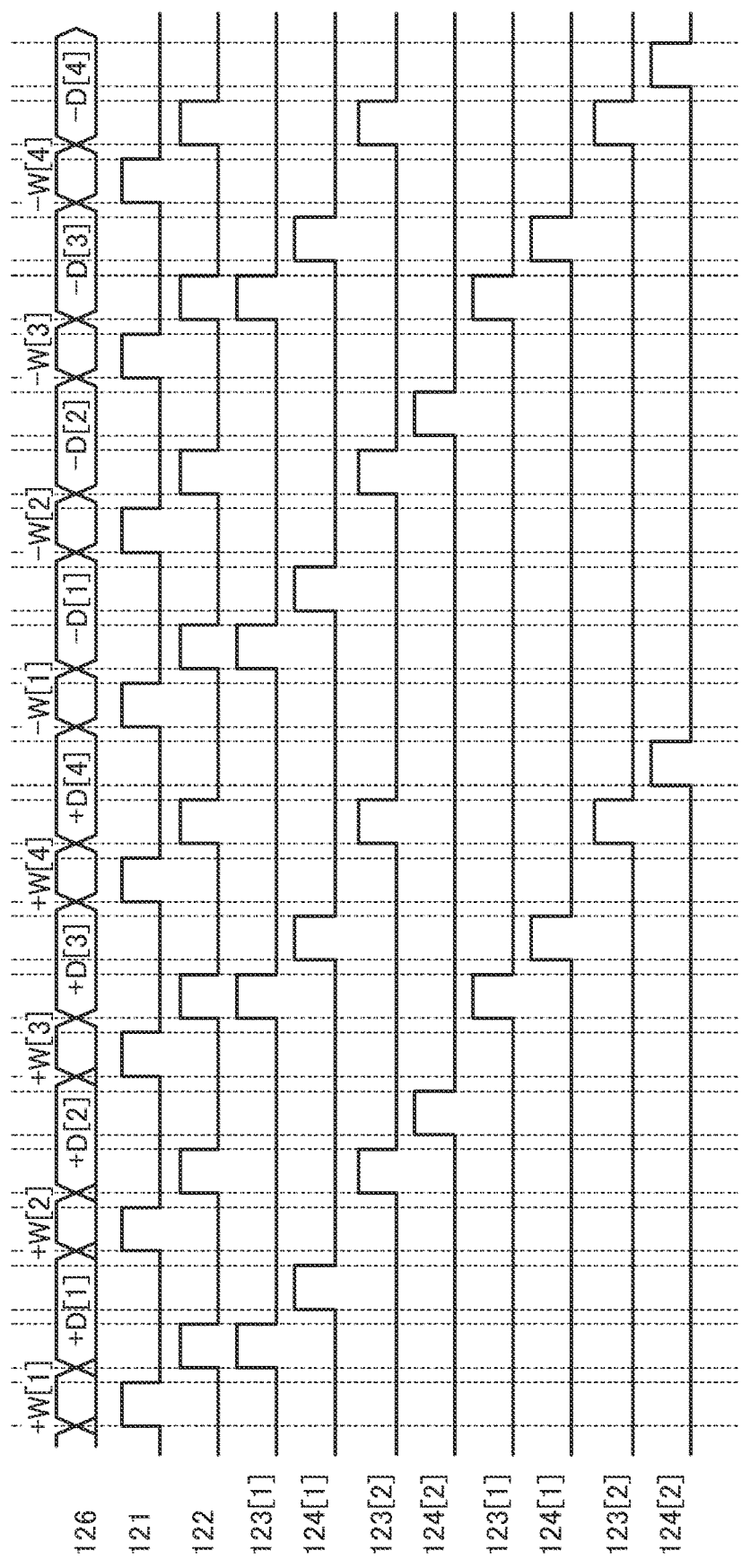
FIG. 13 is a timing chart used for simulation.

FIG. 12 is a timing chart used for the simulation of the operation 1. FIG. 13 is a timing chart used for the simulation of the operation 2. For both the operation 1 and the operation 2, operations of writing data for a positive polarity operation to the pixels PIX[1] to PIX[4] and writing data for a negative polarity operation thereafter are verified. As parameters common to the operation 1 and the operation 2, +5 V is used as the weight (+W) and the data (+D) and −5 V is used as the weight (−W) and the data (−D). Furthermore, all of potentials $V_{ref}$, VCOM, and TCOM are set to 0 V.

Figure 14:
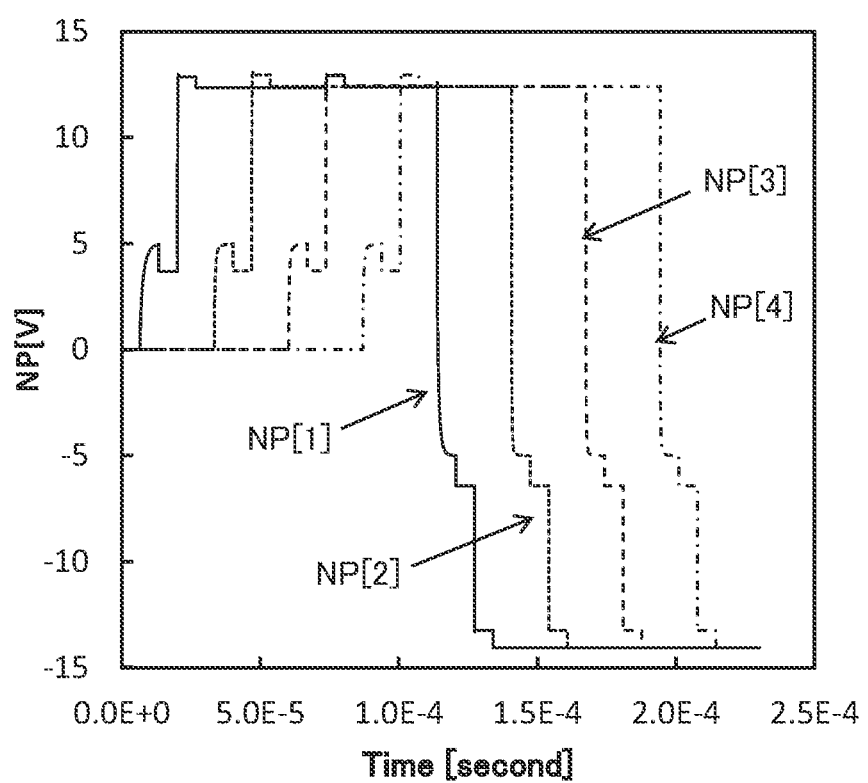
FIG. 14 is a diagram showing simulation results.
Figure 15:
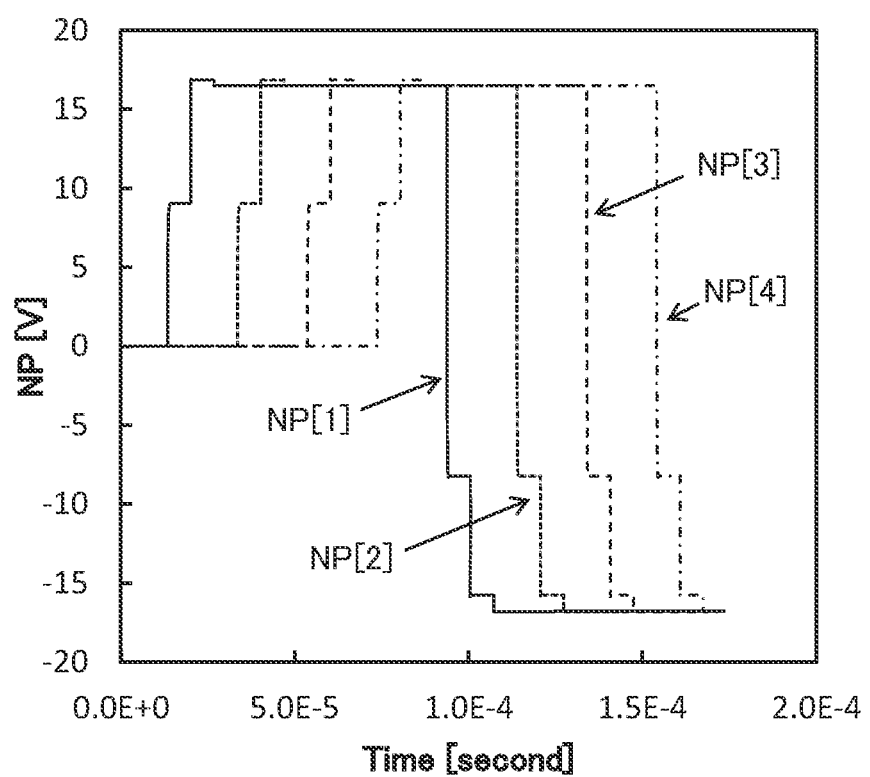
FIG. 15 is a diagram showing simulation results.

FIG. 14 and FIG. 15 are the simulation results of the operation 1 and the operation 2, respectively, and the horizontal axes represent time (second) and the vertical axes represent voltage (V) of the node NP. Each graph shows a voltage change at the nodes NP when a write operation is performed on the pixels PIX[1] to PIX[4] on the time scale.

Although there are effects of feedthrough due to the capacitance between the gate and the drain of the transistor and charge distribution of the capacitors connected in series, in the operation 1, the input voltage can be increased to approximately 2.5 times in the positive polarity operation and to approximately 2.8 times in the negative polarity operation. In the operation 2, the input voltage can be increased to approximately 3.3 times in the positive polarity operation and to approximately 3.4 times in the negative polarity operation. When the electric characteristics of the transistor are improved and the parasitic capacitance is reduced, for example, a higher voltage can be generated.

The above simulation results show the effect of one embodiment of the present invention.

This embodiment can be implemented in an appropriate combination with the structures described in the other embodiments and the like.

Embodiment 2

In this embodiment, a structure example of a display apparatus using a liquid crystal device and a structure example of a display apparatus using a light-emitting device are described. Note that the description of the components, operations, and functions of the display apparatus described in Embodiment 1 is omitted in this embodiment.

The adder circuit and the pixel described in Embodiment 1 can be used in the display apparatus described in this embodiment. Note that a scan line driver circuit and a signal line driver circuit which are described below correspond to the gate driver and the source driver, respectively.

Figure 16A:
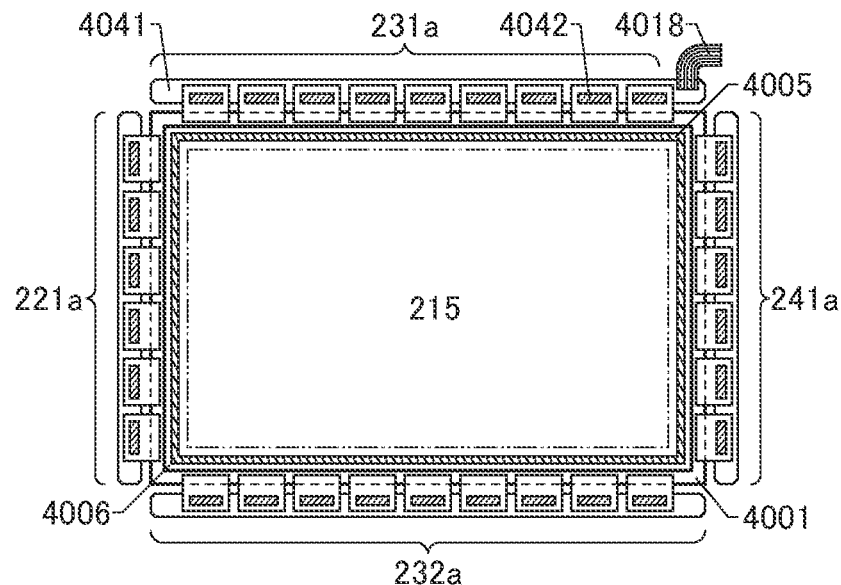
FIG. 16(A) to FIG. 16(C) are diagrams each illustrating a display apparatus.
Figure 16B:
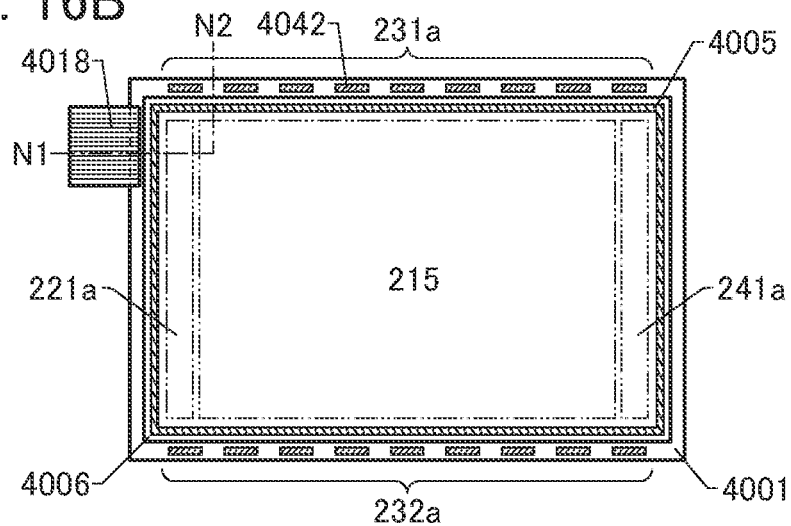
Figure 16C:
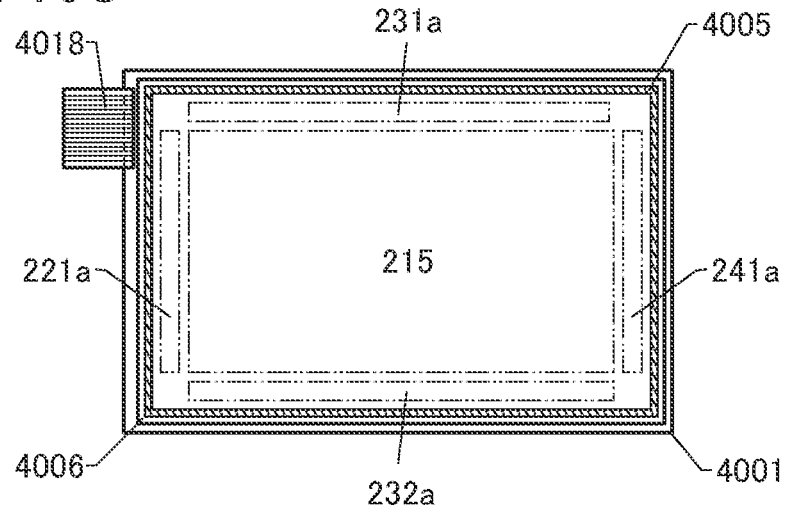

FIGS. 16(A) to 16(C) are diagrams each illustrating a structure of a display apparatus in which one embodiment of the present invention can be used.

In FIG. 16(A), a sealant 4005 is provided to surround a display portion 215 provided over a first substrate 4001, and the display portion 215 is sealed with the sealant 4005 and a second substrate 4006.

In FIG. 16(A), a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The common line driver circuit 241a has a function of supplying a prescribed potential to the wirings 128, 129, 133, 134, and the like described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

FIG. 16(B) illustrates an example in which the integrated circuits 4042 included in the signal line driver circuit 231a and the signal line driver circuit 232a are mounted by a COG method. Some or all of the driver circuits can be formed over the same substrate as the display portion 215, whereby a system-on-panel can be formed.

In the example illustrated in FIG. 16(B), the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 16(B), the sealant 4005 is provided to surround the display portion 215, the scan line driver circuit 221a, and the common line driver circuit 241a provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed with the use of the first substrate 4001, the sealant 4005, and the second substrate 4006.

Although the signal line driver circuit 231a and the signal line driver circuit 232a are separately formed and mounted on the first substrate 4001 in the example illustrated in FIG. 16(B), one embodiment of the present invention is not limited to this structure. The scan line driver circuit may be separately formed and then mounted, part of the signal line driver circuits or part of the scan line driver circuits may be separately formed and then mounted. The signal line driver circuit 231a and the signal line driver circuit 232a may be formed over the same substrate as the display portion 215, as illustrated in FIG. 16(C).

In some cases, the display apparatus encompasses a panel in which the display element is sealed, and a module in which an IC or the like including a controller is mounted on the panel.

The display portion and the scan line driver circuit provided over the first substrate each include a plurality of transistors. As the transistors, the transistor described in the above embodiment can be used.

The transistors included in the peripheral driver circuit and transistors included in the pixel circuits of the display portion may have the same structure or different structures. The transistors included in the peripheral driver circuit may have the same structure, or two or more kinds of structures may be used in combination. Similarly, the transistors included in the pixel circuits may have the same structure, or two or more kinds of structures may be used in combination.

An input device 4200 can be provided over the second substrate 4006. The display apparatuses illustrated in FIGS. 16(A) to 16(C) and provided with the input device 4200 can function as a touch panel.

There is no particular limitation on a sensor element included in the touch panel of one embodiment of the present invention. A variety of sensors capable of sensing an approach or a contact of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferred because multiple points can be sensed simultaneously.

The touch panel of one embodiment of the present invention can have any of a variety of structures, including a structure in which a display apparatus and a sensor element that are separately formed are attached to each other and a structure in which an electrode and the like included in a sensor element are provided on one or both of a substrate supporting a display device and a counter substrate.

Figure 17A:
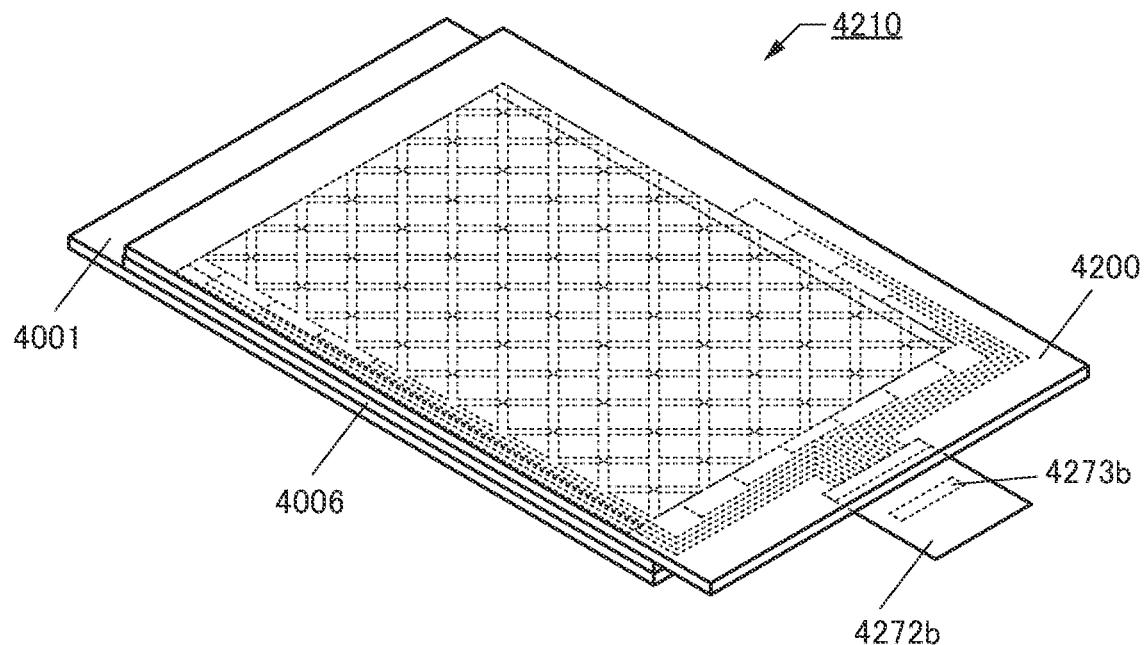
FIG. 17(A) and FIG. 17(B) are diagrams illustrating a touch panel.
Figure 17B:
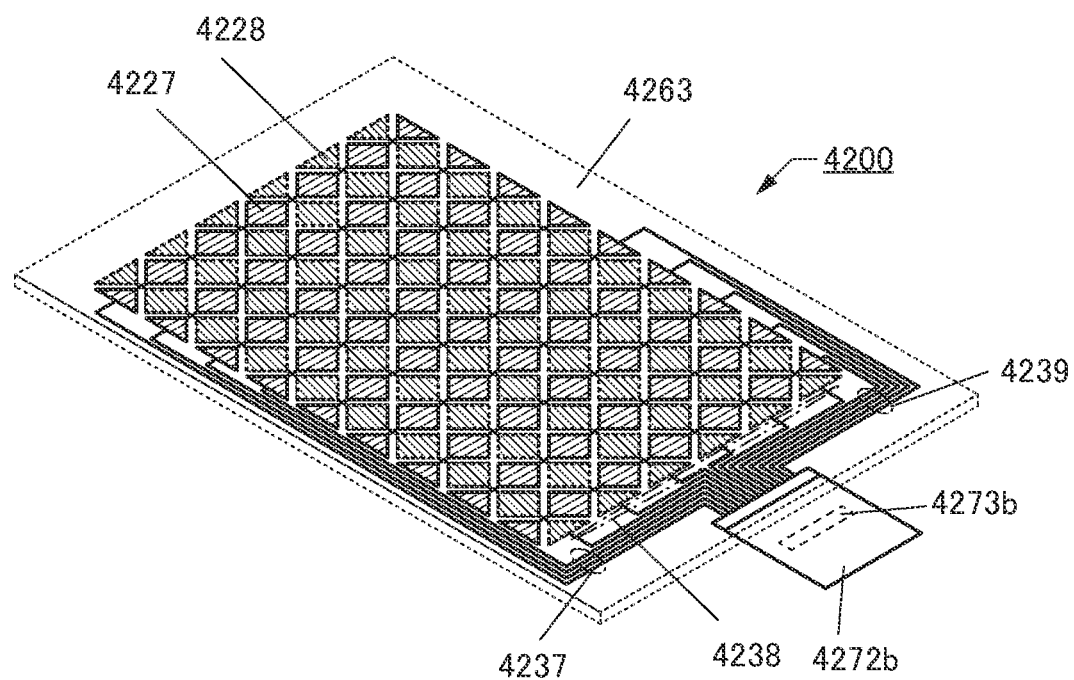

FIGS. 17(A) and 17(B) illustrate an example of the touch panel. FIG. 17(A) is a perspective view of a touch panel 4210. FIG. 17(B) is a schematic perspective view of the input device 4200. Note that for clarity, only typical components are illustrated.

The touch panel 4210 has a structure in which a display apparatus and a sensor element that are separately formed are attached to each other.

The touch panel 4210 includes the input device 4200 and the display apparatus, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to any of the wirings 4237 or any of the wirings 4239. In addition, the electrode 4228 can be electrically connected to any of the wirings 4238. An FPC 4272b is electrically connected to each of the plurality of wirings 4237, the wirings 4238, and the plurality of wirings 4239. An IC 4273b can be provided for the FPC 4272b.

Alternatively, a touch sensor may be provided between the first substrate 4001 and the second substrate 4006 in the display apparatus. In the case where a touch sensor is provided between the first substrate 4001 and the second substrate 4006, either a capacitive touch sensor or an optical touch sensor including a photoelectric conversion element may be used.

FIGS. 18(A) and 18(B) are cross-sectional views of a portion indicated by chain line N1-N2 in FIG. 16(B). Display apparatuses illustrated in FIGS. 18(A) and 18(B) each include an electrode 4015, and the electrode 4015 is electrically connected to a terminal included in the FPC 4018 through an anisotropic conductive layer 4019. In FIGS. 18(A) and 18(B), the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors. In FIGS. 18(A) and 18(B), the transistor 4010 included in the display portion 215 and the transistor 4011 included in the scan line driver circuit 221a are illustrated as an example. Note that in the examples illustrated in FIGS. 18(A) and 18(B), the transistor 4010 and the transistor 4011 are bottom-gate transistors but may be top-gate transistors.

In FIGS. 18(A) and 18(B), the insulating layer 4112 is provided over the transistor 4010 and the transistor 4011. In FIG. 18(B), a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can serve as a back gate electrode.

The display apparatuses illustrated in FIGS. 18(A) and 18(B) each include a capacitor 4020. The capacitor 4020 includes an electrode 4021 formed in the same step as a gate electrode of the transistor 4010, and an electrode formed in the same step as the source electrode and the drain electrode. The electrodes overlap with each other with an insulating layer 4103 therebetween.

In general, the capacitance of a capacitor provided in a pixel portion of a display apparatus is set in consideration of the leakage current or the like of transistors provided in the pixel portion so that charges can be held for a predetermined period. The capacitance of the capacitor is set in consideration of the off-state current of the transistors electrically connected to the capacitor, for example.

The transistor 4010 provided in the display portion 215 is electrically connected to the display device. FIG. 18(A) illustrates an example of a liquid crystal display apparatus using a liquid crystal device as the display device. In FIG. 18(A), a liquid crystal device 4013 serving as the display device includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A liquid crystal device having a variety of modes can be used as the liquid crystal device 4013. For example, a liquid crystal device using a VA (Vertical Alignment) mode, a TN (Twisted Nematic) mode, an IPS (In-Plane-Switching) mode, an ASM (Axially Symmetric aligned Micro-cell) mode, an OCB (Optically Compensated Bend) mode, an FLC (Ferroelectric Liquid Crystal) mode, an AFLC (Anti-Ferroelectric Liquid Crystal) mode, an ECB (Electrically Controlled Birefringence) mode, a VA-IPS mode, a guest-host mode, or the like can be used.

As the liquid crystal display apparatus described in this embodiment, a normally black liquid crystal display apparatus such as a transmissive liquid crystal display apparatus employing a vertical alignment (VA) mode may be used. As the vertical alignment mode, an MVA (Multi-Domain Vertical Alignment) mode, a PVA (Patterned Vertical Alignment) mode, an ASV (Advanced Super View) mode, and the like can be used.

Note that the liquid crystal device is an element that controls transmission and non-transmission of light by the optical modulation action of liquid crystal. The optical modulation action of the liquid crystal is controlled by an electric field applied to the liquid crystal (including a horizontal electric field, a vertical electric field, and an oblique electric field). As the liquid crystal used for the liquid crystal device, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Although an example of a liquid crystal display apparatus including a liquid crystal device with a vertical electric field mode is illustrated in FIG. 18(A), one embodiment of the present invention can be applied to a liquid crystal display apparatus including a liquid crystal device with a horizontal electric field mode. In the case of employing a horizontal electric field mode, liquid crystal exhibiting a blue phase for which an alignment film is not used may be used. The blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which a chiral material of 5 weight % or more is mixed is used for the liquid crystal layer 4008 in order to improve the temperature range. The liquid crystal composition that contains liquid crystal exhibiting a blue phase and a chiral material has a short response speed and exhibits optical isotropy. In addition, the liquid crystal composition containing liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the liquid crystal display apparatus in the manufacturing process can be reduced.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display apparatus illustrated in FIG. 18(A), a light-blocking layer 4132, a coloring layer 4131, and an insulating layer 4133 are provided between the substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material used for the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

Examples of a material that can be used for the coloring layer include a metal material, a resin material, and a resin material containing a pigment or a dye. The light-blocking layer and the coloring layer are formed similarly to the above layers. For example, an inkjet method may be used.

The display apparatuses illustrated in FIGS. 18(A) and 18(B) each include the insulating layer 4111 and an insulating layer 4104. For the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

Alight-emitting device can be used as the display device included in the display apparatus. As the light-emitting device, for example, an EL element that utilizes electroluminescence can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In the organic EL element, by voltage application, electrons are injected from one electrode to the EL layer and holes are injected from the other electrode to the EL layer. The carriers (electrons and holes) are recombined, the light-emitting organic compound forms an excited state, and the organic compound emits light when the excited state returns to a ground state. Owing to such a mechanism, this light-emitting device is referred to as a current-excitation light-emitting device.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is positioned between dielectric layers, which are further positioned between electrodes, and its light emission mechanism is localization type light emission that utilizes inner-shell electron transition of metal ions. Note that the description is made here using an organic EL element as the light-emitting device.

In order to extract light emitted from the light-emitting device, at least one of the pair of electrodes needs to be transparent. A transistor and a light-emitting device are formed over a substrate. The light-emitting device can have atop emission structure in which light emission is extracted from the surface on the side opposite to the substrate; a bottom emission structure in which light emission is extracted from the surface on the substrate side; or a dual emission structure in which light emission is extracted from both surfaces. The light-emitting device having any of the emission structures can be used.

FIG. 18(B) illustrates an example of a light-emitting display apparatus using a light-emitting device as a display device (also referred to as an "EL display apparatus"). A light-emitting device 4513 serving as the display device is electrically connected to the transistor 4010 provided in the display portion 215. Note that the structure of the light-emitting device 4513 is a stacked-layer structure of the first electrode layer 4030, a light-emitting layer 4511, and the second electrode layer 4031; however, this embodiment is not limited to this structure. The structure of the light-emitting device 4513 can be changed as appropriate depending on the direction in which light is extracted from the light-emitting device 4513, or the like.

The partition wall 4510 is formed using an organic insulating material or an inorganic insulating material. It is particularly preferable that the partition wall 4510 be formed using a photosensitive resin material to have an opening portion over the first electrode layer 4030 such that a side surface of the opening portion slopes with continuous curvature.

The light-emitting layer 4511 may be formed using a single layer or a plurality of layers stacked.

The emission color of the light-emitting device 4513 can be white, red, green, blue, cyan, magenta, yellow, or the like depending on the material for the light-emitting layer 4511.

As a color display method, there are a method in which the light-emitting device 4513 that emits white light is combined with a coloring layer and a method in which the light-emitting device 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method. In the latter method, the color purity can be further increased when the light-emitting device 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting device 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting device. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting device has a microcavity structure, light with high color purity can be extracted. Furthermore, when a microcavity structure and a color filter are used in combination, the glare can be reduced and visibility of a displayed image can be increased.

The first electrode layer and the second electrode layer (also called a pixel electrode layer, a common electrode layer, a counter electrode layer, or the like) for applying voltage to the display device each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Figure 19:
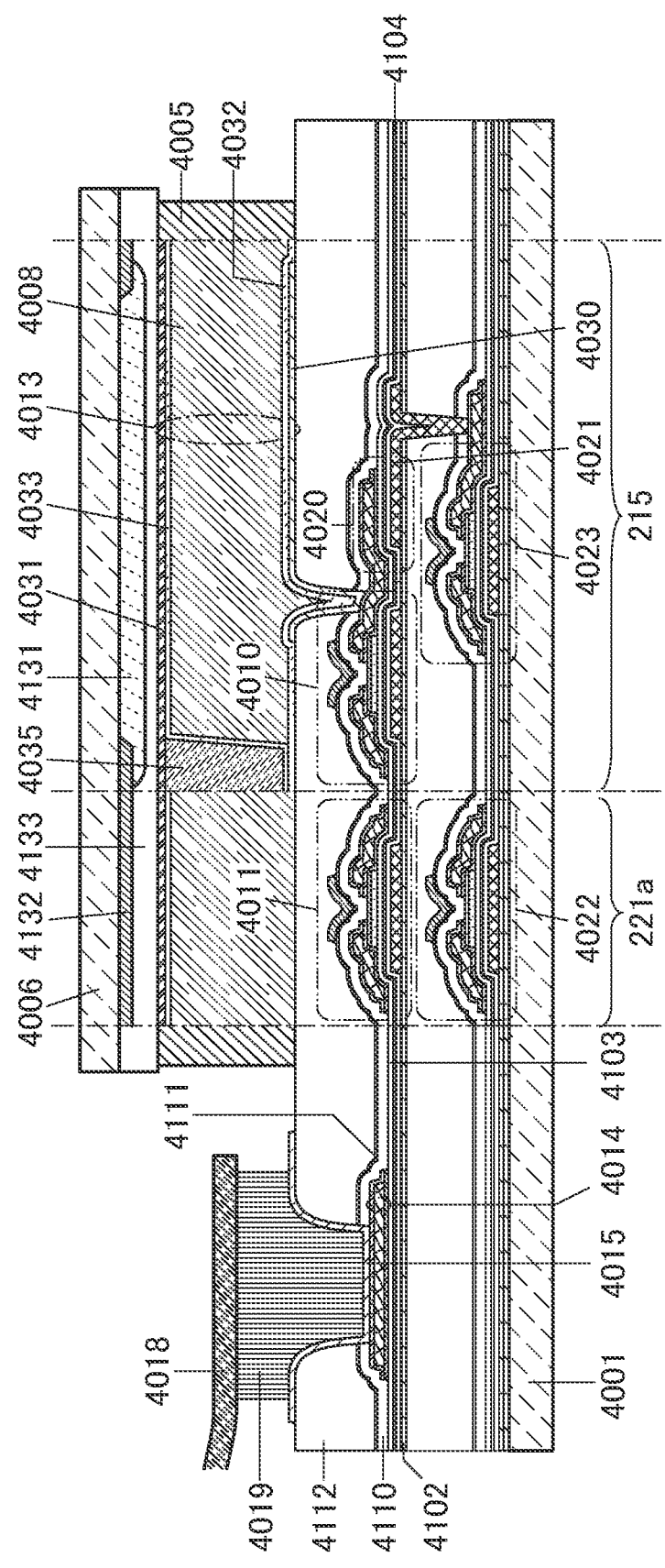
FIG. 19 is a diagram illustrating a display apparatus.

Note that as illustrated in FIG. 19, a stacked structure including a region where a transistor and a capacitor overlap with each other in the height direction may be employed. For example, when the transistor 4011 and a transistor 4022 included in the driver circuit are provided to overlap with each other, a display apparatus with a narrow frame can be provided. Furthermore, when the transistor 4010, a transistor 4023, the capacitor 4020, and the like included in the pixel circuit are provided to at least partly overlap with each other, the aperture ratio and the resolution can be improved. Although an example in which the stacked structure is employed for the liquid crystal display apparatus illustrated in FIG. 18(A) is illustrated in FIG. 19, the stacked structure may be employed for the EL display apparatus illustrated in FIG. 18(B).

In addition, a conductive film with high visible-light-transmitting property is used as an electrode or a wiring in the pixel circuit, whereby transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

The display apparatus may have a structure with a combination of a liquid crystal display apparatus and a light-emitting apparatus.

The light-emitting apparatus is disposed on the side opposite to the display surface or on an end portion of the display surface. The light-emitting apparatus has a function of supplying light to the display device. The light-emitting apparatus can also be referred to as a backlight.

Here, the light-emitting apparatus can include a plate-like or sheet-like light guide portion (also referred to as a light guide plate) and a plurality of light-emitting devices which emit light of different colors. When the light-emitting devices are disposed in the vicinity of the side surface of the light guide portion, light can be emitted from the side surface of the light guide portion to the inside. The light guide portion has a mechanism that changes an optical path (also referred to as a light extraction mechanism), and this enables the light-emitting apparatus to emit light uniformly to a pixel portion of a display panel. Alternatively, the light-emitting apparatus may be provided directly under the pixel without providing the light guide portion.

The light-emitting apparatus preferably includes light-emitting devices of three colors, red (R), green (G), and blue (B). In addition, a light-emitting device of white (W) may be included. A light emitting diode (LED) is preferably used as these light-emitting devices.

Furthermore, the light-emitting devices preferably have extremely high color purities; the full width at half maximum (FWHM) of the emission spectrum of the light-emitting device is less than or equal to 50 nm, preferably less than or equal to 40 nm, further preferably less than or equal to 30 nm, still further preferably less than or equal to 20 nm. Note that the full width at half maximum of the emission spectrum is preferably as small as possible, and can be, for example, greater than or equal to 1 nm. Thus, when a color image us displayed, a vivid image with high color reproducibility can be displayed.

As the red light-emitting device, an element whose wavelength of an emission spectrum peak is in a range from 625 nm to 650 nm is preferably used. As the green light-emitting device, an element whose wavelength of an emission spectrum peak is in a range from 515 nm to 540 nm is preferably used. As the blue light-emitting device, an element whose wavelength of an emission spectrum peak is in a range from 445 nm to 470 nm is preferably used.

The display apparatus can make the light-emitting devices of the three colors blink sequentially, drive the pixels in synchronization with these light-emitting elements, and display a color image on the basis of the successive additive color mixing method. This driving method can also be referred to as a field-sequential driving.

By the field-sequential driving, a clear color image can be displayed. In addition, a smooth moving image can be displayed. When the above-described driving method is used, one pixel does not need to be formed with subpixels of different colors, which can make an effective reflection area (also referred to as an effective display area or an aperture ratio) per pixel large; thus, a bright image can be displayed. Furthermore, the pixels do not need to be provided with color filters, and thus can have improved transmittance and achieve brighter image display. In addition, the manufacturing process can be simplified, and the manufacturing costs can be reduced.

FIGS. 20(A) and 20(B) each illustrate an example of a schematic cross-sectional view of a display apparatus capable of the field-sequential driving. A backlight unit capable of emitting light of RGB colors is provided on the substrate 4001 side of the display apparatus. Note that in the field-sequential driving, the RGB colors are expressed through time division light emission, and thus color filters are not needed.

A backlight unit 4340*a* illustrated in FIG. 20(A) has a structure in which a plurality of light-emitting devices 4342 are provided directly under a pixel with a diffusing plate 4352 positioned therebetween. The diffusing plate 4352 have functions of diffusing light emitted from the light-emitting device 4342 to the substrate 4001 side and making the luminance in a display portion uniform. Between the light-emitting device 4342 and the diffusing plate 4352, a polarizing plate may be provided if necessary. The diffusing plate 4352 does not need to be provided if not needed. The light-blocking layer 4132 may be omitted.

The backlight unit 4340*a* can include a large number of light-emitting devices 4342, which enables bright image display. Moreover, there are advantages that a light guide plate is not needed and light efficiency of the light-emitting device 4342 is less likely to be lowered. Note that the light-emitting device 4342 may be provided with a light diffusion lens 4344 if necessary.

A backlight unit 4340*b* illustrated in FIG. 20(B) has a structure in which a light guide plate 4341 is provided directly under a pixel with the diffusing plate 4352 positioned therebetween. The plurality of light-emitting devices 4342 are provided at an end portion of the light guide plate 4341. The light guide plate 4341 has an uneven shape on the side opposite to the diffusing plate 4352, and can scatter waveguided light with the uneven shape to emit the light in the direction of the diffusing plate 4352.

The light-emitting device 4342 can be fixed to a printed circuit board 4347. Note that in FIG. 20(B), the light-emitting devices 4342 of RGB colors overlap with each other; however, the light-emitting devices 4342 of RGB colors can be arranged to be lined up in the depth direction. A reflective layer 4348 that reflects visible light may be provided on the side surface of the light guide plate 4341 which is opposite to the light-emitting device 4342.

The backlight unit 4340*b* can reduce the number of light-emitting devices 4342, leading to reductions in cost and thickness.

A light-scattering liquid crystal device may be used as the liquid crystal device. The light-scattering liquid crystal device is preferably an element containing a composite material of liquid crystal and a polymer molecule. For example, a polymer dispersed liquid crystal device can be used. Alternatively, a polymer network liquid crystal (PNLC) element may be used.

The light-scattering liquid crystal device has a structure in which a liquid crystal portion is provided in a three-dimensional network structure of a resin portion sandwiched between a pair of electrodes. As a material used in the liquid crystal portion, for example, a nematic liquid crystal can be used. A photocurable resin can be used for the resin portion. The photocurable resin can be a monofunctional monomer, such as acrylate or methacrylate; a polyfunctional monomer, such as diacrylate, triacrylate, dimethacrylate, or trimethacrylate; or a polymerizable compound obtained by mixing these.

The light-scattering liquid crystal device displays an image by transmitting or scattering light utilizing the anisotropy of a refractive index of a liquid crystal material. The resin portion may have the anisotropy of a refractive index. When liquid crystal molecules are arranged in a certain direction in accordance with a voltage applied to the light-scattering liquid crystal device, a direction is generated at which a difference in a refractive index between the liquid crystal portion and the resin portion is small. Incident light along the direction passes without being scattered in the liquid crystal portion. Thus, the light-scattering liquid crystal device is perceived in a transparent state from the direction. By contrast, when liquid crystal molecules are arranged randomly in accordance with the applied voltage, a large difference in refractive index between the liquid crystal portion and the resin portion is not generated, and incident light is scattered in the liquid crystal portion. Thus, the light-scattering liquid crystal device is in an opaque state regardless of the viewing direction.

FIG. 21(A) illustrates a structure in which the liquid crystal device 4013 of the display apparatus illustrated in FIG. 20(A) is replaced by a light-scattering liquid crystal device 4016. The light-scattering liquid crystal device 4016 includes a composite layer 4009 including a liquid crystal portion and a resin portion, and the electrode layers 4030 and 4031. Although components relating to the field-sequential driving are the same as those in FIG. 20(A), when the light-scattering liquid crystal device 4016 is used, an alignment film and a polarizing plate are not necessary. Note that the spherical spacer 4035 is illustrated, but the spacer 4035 may have a columnar shape.

FIG. 21(B) illustrates a structure in which the liquid crystal device 4013 of the display apparatus illustrated in FIG. 20(B) is replaced by the light-scattering liquid crystal device 4016. In the structure of FIG. 20(B), it is preferable that light be transmitted when a voltage is not applied to the light-scattering liquid crystal device 4016, and light be scattered when a voltage is applied. With such a structure, the display apparatus can be transparent in a normal state (state in which no image is displayed). In that case, a color image can be displayed when alight scattering operation is performed.

FIGS. 22(A) to 22(E) illustrate modification examples of the display apparatus in FIG. 21(B). Note that in FIGS. 22(A) to 22(E), some components in FIG. 21(B) are used and the other components are not illustrated for simplicity.

Figure 22A:
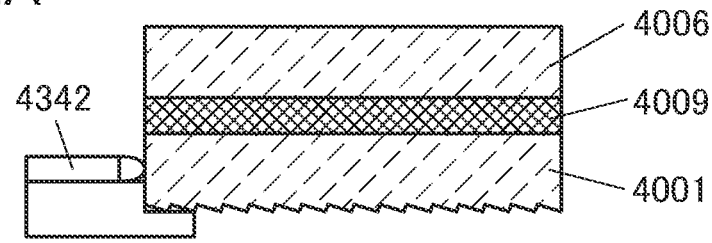
FIG. 22(A) to FIG. 22(E) are diagrams each illustrating a display apparatus.

FIG. 22(A) illustrates a structure in which the substrate 4001 has a function of a light guide plate. An uneven surface may be provided on an outer surface of the substrate 4001. With this structure, a light guide plate does not need to be provided additionally, leading to a reduction in a manufacturing cost. Furthermore, the attenuation of light caused by the light guide plate also does not occur; accordingly, light emitted from the light-emitting device 4342 can be efficiently utilized.

Figure 22B:
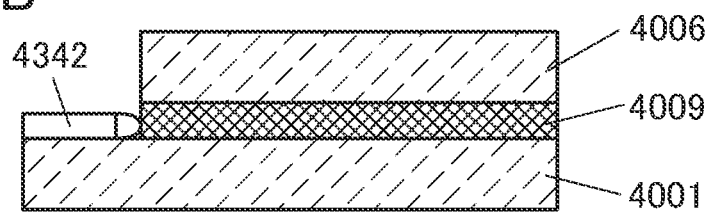

FIG. 22(B) illustrates a structure in which light enters from the vicinity of an end portion of the composite layer 4009. By utilizing total reflection at the interface between the composite layer 4009 and the substrate 4006 and the interface between the composite layer 4009 and the substrate 4001, light can be emitted to the outside from the light-scattering liquid crystal device. For the resin portion of the composite layer 4009, a material having a refractive index higher than that of the substrate 4001 and that of the substrate 4006 is used.

Figure 22C:
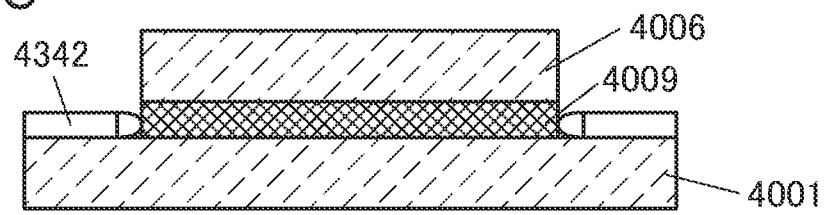

Note that the light-emitting device 4342 may be provided on one side of the display apparatus, or may be provided on each of two sides facing each other as illustrated in FIG. 22(C). Furthermore, the light-emitting devices 4342 may be provided on three sides or four sides. When the light-emitting devices 4342 are provided on a plurality of sides, attenuation of light can be compensated for and application to a large-area display element is possible.

Figure 22D:
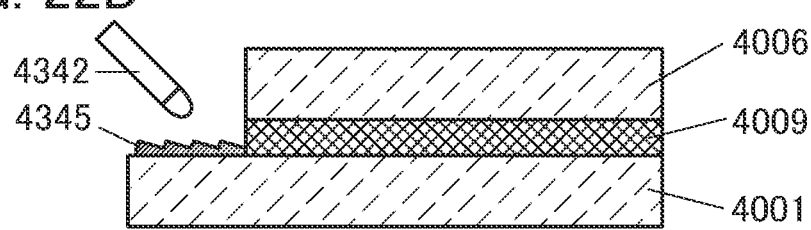

FIG. 22(D) illustrates a structure in which light emitted from the light-emitting device 4342 is guided to the display apparatus through a mirror 4345. With this structure, light can be guided easily with a certain angle to the display apparatus; thus, total reflection light can be obtained efficiently.

Figure 22E:
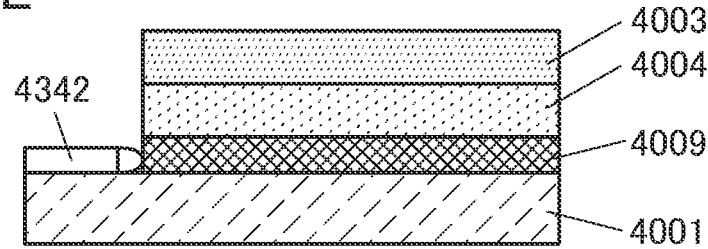

FIG. 22(E) illustrates a structure in which a layer 4003 and a layer 4004 are stacked over the composite layer 4009. One of the layer 4003 and the layer 4004 is a support such as a glass substrate, and the other can be formed of an inorganic film, a coating film of an organic resin, a film, or the like. For the resin portion of the composite layer 4009, a material having a refractive index higher than that of the layer 4004 is used. For the layer 4004, a material having a refractive index higher than that of the layer 4003 is used.

A first interface is formed between the composite layer 4009 and the layer 4004, and a second interface is formed between the layer 4004 and the layer 4003. With this structure, light passing through the first interface without being totally reflected is totally reflected at the second interface and can be returned to the composite layer 4009. Accordingly, light emitted from the light-emitting device 4342 can be efficiently utilized.

Note that the structures in FIG. 21(B) and FIGS. 22(A) to 22(E) can be combined with each other.

This embodiment can be implemented in an appropriate combination with the structures described in the other embodiments and the like.

Embodiment 3

In this embodiment, examples of transistors which can be used as the transistors described in the above embodiments are described with reference to drawings.

The display apparatus of one embodiment of the present invention can be fabricated using a transistor with any of various structures, such as a bottom-gate transistor or a top-gate transistor. Therefore, a material of a semiconductor layer or the structure of a transistor can be easily changed depending on the existing production line.

[Bottom-Gate Transistor]

FIG. 23(A1) is a cross-sectional view of a channel-protective transistor 810, which is a type of bottom-gate transistor, in the channel length direction. In FIG. 23(A1), the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

Furthermore, an insulating layer 741 is provided over a channel formation region in the semiconductor layer 742. Furthermore, an electrode 744a and an electrode 744b are provided over the insulating layer 726 to be partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b which are in contact with the semiconductor layer 742. The carrier concentration in the regions of the semiconductor layer 742 where oxygen vacancies are generated is increased, so that the regions become n-type regions (n$^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 23(A2) is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or a given potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having a high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 23(B1) is a cross-sectional view of a channel-protective transistor 820, which has a structure different from FIG. 23(A1), in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening portion formed by selectively removing part of the insulating layer 741 that overlaps with the semiconductor layer 742. The semiconductor layer 742 is electrically connected to the electrode 744b through another opening portion formed by selectively removing part of the insulating layer 741 that overlaps with the semiconductor layer 742. A region of the insulating layer 741 that overlaps with the channel formation region can function as a channel protective layer.

A transistor 821 illustrated in FIG. 23(B2) is different from the transistor 820 in that the electrode 723 that can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744*b* and the electrode 746 can be reduced. According to one embodiment of the present invention, a transistor with favorable electrical characteristics can be provided.

FIG. 23(C1) is a cross-sectional view of a channel-etched transistor 825, which is a type of bottom-gate transistor, in the channel length direction. In the transistor 825, the electrode 744*a* and the electrode 744*b* are formed without the insulating layer 729. Thus, part of the semiconductor layer 742 that is exposed at the time of forming the electrode 744*a* and the electrode 744*b* might be etched. However, since the insulating layer 729 is not provided, the productivity of the transistor can be increased.

A transistor 826 illustrated in FIG. 23(C2) is different from the transistor 820 in that the electrode 723 that can function as a back gate electrode is provided over the insulating layer 729.

FIGS. 24(A1) to 24(C2) are cross-sectional views of the transistors 810, 811, 820, 821, 825, and 826 in the channel width direction, respectively.

In each of the structures illustrated in FIGS. 24(B2) and 24(C2), the gate electrode is connected to the back gate electrode, and the gate electrode and the back gate electrode have the same potential. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode and the back gate electrode with the insulating layers 726, 741, 728, and 729 positioned therebetween.

In this structure, the semiconductor layer 742 included in the transistor can be electrically surrounded by electric fields of the gate electrode and the back gate electrode.

The transistor device structure in which the semiconductor layer 742 in which the channel formation region is formed is electrically surrounded by electric fields of the gate electrode and the back gate electrode, as in the transistor 821 and the transistor 826, can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

[Top-Gate Transistor]

A transistor 842 illustrated in FIG. 25(A1) is a type of top-gate transistor. The electrode 744*a* and the electrode 744*b* are electrically connected to the semiconductor layer 742 through opening portions formed in the insulating layer 728 and the insulating layer 729.

Part of the insulating layer 726 that does not overlap with the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than the semiconductor layer 742 in a region into which the impurity is introduced not through the insulating layer 726. Thus, an LDD (Lightly Doped Drain) region is formed in a region of the semiconductor layer 742 not overlapping with the electrode 746.

A transistor 843 illustrated in FIG. 25(A2) is different from the transistor 842 in that the electrode 723 is included. The transistor 843 includes the electrode 723 that is formed over the substrate 771. The electrode 723 includes a region overlapping with the semiconductor layer 742 with the insulating layer 772 therebetween. The electrode 723 can function as a back gate electrode.

As in a transistor 844 illustrated in FIG. 25(B1) and a transistor 845 illustrated in FIG. 25(B2), the insulating layer 726 in a region that does not overlap with the electrode 746 may be completely removed. Alternatively, as in a transistor 846 illustrated in FIG. 25(C1) and a transistor 847 illustrated in FIG. 25(C2), the insulating layer 726 may be left.

Also in the transistor 842 to the transistor 847, after the formation of the electrode 746, an impurity is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIGS. 26(A1) to 26(C2) are cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in an appropriate combination with the structures described in the other embodiments and the like.

Embodiment 4

Examples of an electronic device that can use the display apparatus of one embodiment of the present invention include display devices, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 27 illustrates specific examples of such electronic devices.

Figure 27A:
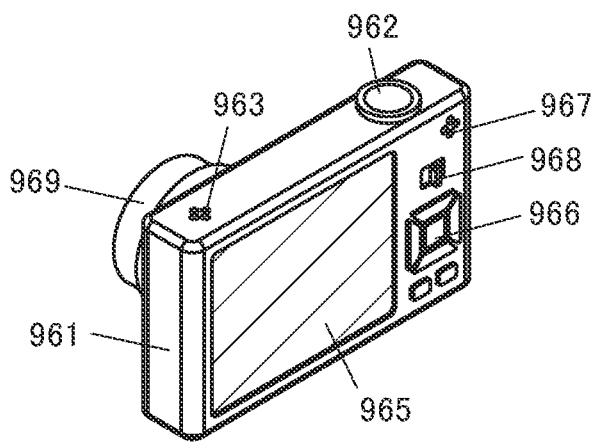
FIG. 27(A) to FIG. 27(F) are diagrams illustrating electronic devices.

FIG. 27(A) illustrates a digital camera, which includes a housing 961, a shutter button 962, a microphone 963, a speaker 967, a display portion 965, operation keys 966, a zoom lever 968, a lens 969, and the like. With the use of the display apparatus of one embodiment of the present invention for the display portion 965, a variety of images can be displayed.

Figure 27B:
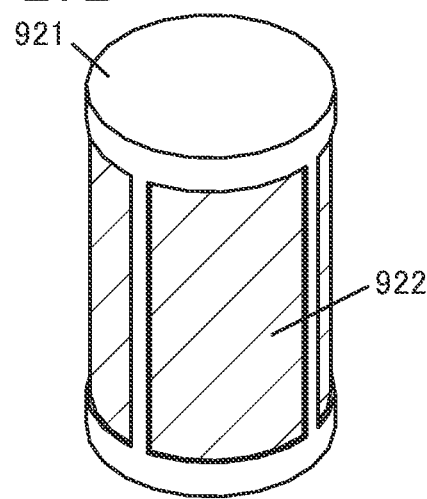

FIG. 27(B) illustrates digital signage which has a large display portion 922. The large display portion 922 in the digital signage is attached to a side surface of a pillar 921, for example. With the use of the display apparatus of one embodiment of the present invention for the display portion 922, an image can be displayed with high display quality.

Figure 27C:
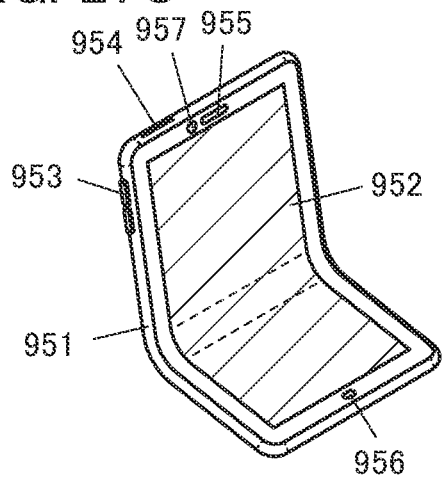

FIG. 27(C) illustrates a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 951 and the display portion 952 have flexibility and can be used in a bent state as illustrated in the figure. With the use of the display apparatus of one embodiment of the present invention for the display portion 952, a variety of images can be displayed.

Figure 27D:
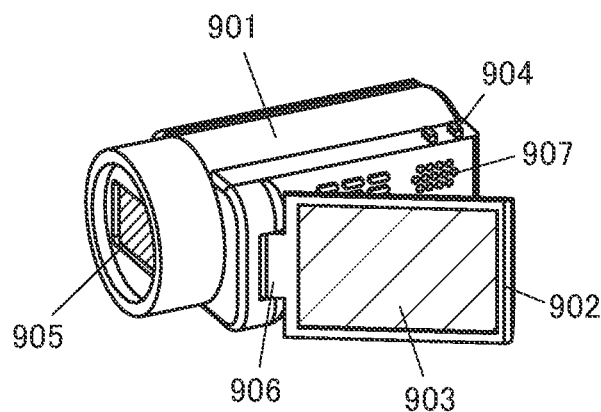

FIG. 27(D) illustrates a video camera, which includes a first housing 901, a second housing 902, a display portion 903, an operation key 904, a lens 905, a connection portion 906, a speaker 907, and the like. The operation key 904 and the lens 905 are provided on the first housing 901, and the display portion 903 is provided on the second housing 902. With the use of the display apparatus of one embodiment of the present invention for the display portion 903, a variety of images can be displayed.

Figure 27E:
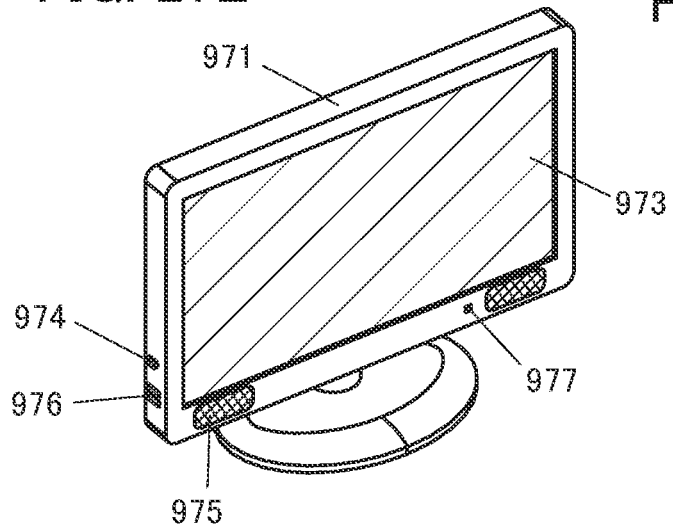

FIG. 27(E) illustrates a television, which includes a housing 971, a display portion 973, an operation key 974, speakers 975, a communication connection terminal 976, an optical sensor 977, and the like. The display portion 973 includes a touch sensor that enables an input operation. With the use of the display apparatus of one embodiment of the present invention for the display portion 973, a variety of images can be displayed.

Figure 27F:
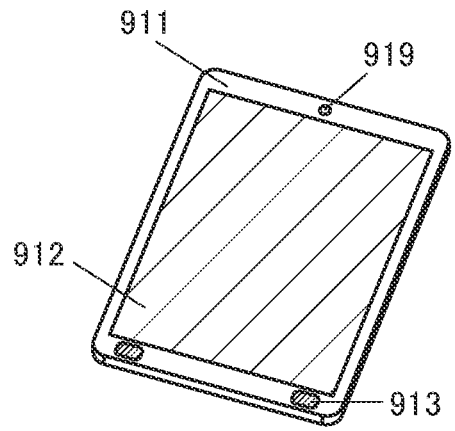

FIG. 27(F) illustrates a portable data terminal, which includes a housing 911, a display portion 912, speakers 913, a camera 919, and the like. A touch panel included in the display portion 912 enables input and output of information. With the use of the display apparatus of one embodiment of the present invention for the display portion 912, a variety of images can be displayed.

This embodiment can be implemented in an appropriate combination with the structures described in the other embodiments and the like.

REFERENCE NUMERALS

10: pixel, 11: circuit, 11a: circuit, 11b: circuit, 12: source driver, 12a: source driver, 12b: source driver, 13: gate driver, 15: display region, 16: selection circuit, 20: circuit, 101: transistor, 102: transistor, 103: transistor, 104: transistor, 105: transistor, 106: transistor, 107: capacitor, 108: capacitor, 109: capacitor, 110: circuit block, 111: transistor, 112: transistor, 113: capacitor, 114: light-emitting device, 115: transistor, 116: capacitor, 117: liquid crystal device, 118: transistor, 119: transistor, 120: circuit, 121: wiring, 121a: wiring, 121b: wiring, 122: wiring, 122a: wiring, 122b: wiring, 123: wiring, 124: wiring, 125: wiring, 126: wiring, 127: wiring, 128: wiring, 129: wiring, 130: wiring, 131: wiring, 132: wiring, 133: wiring, 134: wiring, 135: wiring, 136: wiring, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 901: housing, 902: housing, 903: display portion, 904: operation key, 905: lens, 906: connection portion, 907: speaker, 911: housing, 912: display portion, 913: speaker, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 4001: substrate, 4003: layer, 4004: layer, 4005: sealant, 4006: substrate, 4008: liquid crystal layer, 4009: composite layer, 4010: transistor, 4011: transistor, 4013: liquid crystal device, 4014: wiring, 4015: electrode, 4016: light-scattering liquid crystal device, 4017: electrode, 4018: FPC, 4019: anisotropic conductive layer, 4020: capacitor, 4021: electrode, 4022: transistor, 4023: transistor, 4030: electrode layer, 4031: electrode layer, 4032: insulating layer, 4033: insulating layer, 4035: spacer, 4041: printed circuit board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4340a: backlight unit, 4340b: backlight unit, 4341: light guide plate, 4342: light-emitting device, 4344: lens, 4345: mirror, 4347: printed circuit board, 4348: reflective layer, 4352: diffusing plate, 4510: partition, 4511: light-emitting layer, 4513: light-emitting device, 4514: filler

The invention claimed is:

1. A display apparatus comprising:
   a first circuit comprising a first transistor, a second transistor, a third transistor, and a first capacitor; and
   a pixel,
   wherein the first transistor, the second transistor, and the third transistor are positioned outside a display region,
   wherein the first capacitor and the pixel are positioned in the display region,
   wherein the pixel and the first circuit are electrically connected to each other,
   wherein the first circuit is configured to add first data and second data to generate third data,
   wherein the pixel is configured to add the first data and the third data to generate fourth data and is configured to display an image according to the fourth data,
   wherein the first capacitor comprises a plurality of second capacitors, and
   wherein the second capacitors are connected in parallel.

2. The display apparatus according to claim 1,
   wherein one of a source and a drain of the first transistor is electrically connected to the pixel,
   wherein the one of the source and the drain of the first transistor is electrically connected to one electrode of the first capacitor,
   wherein the other electrode of the first capacitor is electrically connected to one of a source and a drain of the second transistor,
   wherein the one of the source and the drain of the second transistor is electrically connected to one of a source and a drain of the third transistor, and
   wherein the other of the source and the drain of the first transistor is electrically connected to the other of the source and the drain of the second transistor.

3. The display apparatus according to claim 2,
wherein the pixel comprises a fourth transistor, a fifth transistor, a sixth transistor, a third capacitor, and a second circuit,
wherein one of a source and a drain of the fourth transistor is electrically connected to one electrode of the third capacitor,
wherein the one electrode of the third capacitor is electrically connected to the second circuit,
wherein the other electrode of the third capacitor is electrically connected to one of a source and a drain of the fifth transistor,
wherein the one of the source and the drain of the fifth transistor is electrically connected to one of a source and a drain of the sixth transistor,
wherein the other of the source and the drain of the fourth transistor is electrically connected to the first circuit,
wherein the other of the source and the drain of the fifth transistor is electrically connected to the first circuit, and
wherein the second circuit comprises a display device.

4. The display apparatus according to claim 3,
wherein the second circuit comprises a seventh transistor, a fourth capacitor, and a light-emitting device as the display device,
wherein a gate of the seventh transistor is electrically connected to the other of the source and the drain of the fourth transistor,
wherein one of a source and a drain of the seventh transistor is electrically connected to one electrode of the light-emitting device,
wherein the one electrode of the light-emitting device is electrically connected to one electrode of the fourth capacitor, and
wherein the other electrode of the fourth capacitor is electrically connected to the gate of the seventh transistor.

5. The display apparatus according to claim 3,
wherein the second circuit comprises a liquid crystal device as the display device, and
wherein one electrode of the liquid crystal device is electrically connected to the one of the source and the drain of the fourth transistor.

6. The display apparatus according to claim 5, further comprising a fifth capacitor,
wherein one electrode of the fifth capacitor is electrically connected to the one electrode of the liquid crystal device.

7. The display apparatus according to claim 1,
wherein the pixel comprises a transistor,
wherein the transistor in the pixel, the first transistor, the second transistor, and the third transistor each comprise a metal oxide in a channel formation region,
wherein the metal oxide comprise In, Zn, and M, and
wherein M is at least one of Al, Ti, Ga, Sn, Y, Zr, La, Ce, Nd, and Hf.

8. The display apparatus according to claim 1,
wherein the pixel comprises a transistor, and
wherein a channel width of each of the first transistor, the second transistor, and the third transistor is larger than a channel width of the transistor in the pixel.

9. An electronic device comprising the display apparatus according to claim 1, and a camera.

10. A display apparatus comprising:
a first circuit comprising a first transistor, a second transistor, a third transistor, and a first capacitor; and
a pixel,
wherein the first transistor, the second transistor, and the third transistor are positioned outside a display region,
wherein the first capacitor and the pixel are positioned in the display region,
wherein the pixel and the first circuit are electrically connected to each other,
wherein the first circuit is configured to add first data and second data to generate third data,
wherein the pixel is configured to add the third data to the third data to generate fourth data and is configured to display an image according to the fourth data,
wherein the first capacitor comprises a plurality of second capacitors, and
wherein the second capacitors are connected in parallel.

11. The display apparatus according to claim 10,
wherein one of a source and a drain of the first transistor is electrically connected to the pixel,
wherein the one of the source and the drain of the first transistor is electrically connected to one electrode of the first capacitor,
wherein the other electrode of the first capacitor is electrically connected to one of a source and a drain of the second transistor,
wherein the one of the source and the drain of the second transistor is electrically connected to one of a source and a drain of the third transistor, and
wherein the other of the source and the drain of the first transistor is electrically connected to the other of the source and the drain of the second transistor.

12. The display apparatus according to claim 11,
wherein the pixel comprises a fourth transistor, a fifth transistor, a sixth transistor, a third capacitor, and a second circuit,
wherein one of a source and a drain of the fourth transistor is electrically connected to one electrode of the third capacitor,
wherein the one electrode of the third capacitor is electrically connected to the second circuit,
wherein the other electrode of the third capacitor is electrically connected to one of a source and a drain of the fifth transistor,
wherein the one of the source and the drain of the fifth transistor is electrically connected to one of a source and a drain of the sixth transistor,
wherein the other of the source and the drain of the fourth transistor is electrically connected to the first circuit,
wherein the other of the source and the drain of the fifth transistor is electrically connected to the first circuit, and
wherein the second circuit comprises a display device.

13. The display apparatus according to claim 12,
wherein the second circuit comprises a seventh transistor, a fourth capacitor, and a light-emitting device as the display device,
wherein a gate of the seventh transistor is electrically connected to the other of the source and the drain of the fourth transistor,
wherein one of a source and a drain of the seventh transistor is electrically connected to one electrode of the light-emitting device,
wherein the one electrode of the light-emitting device is electrically connected to one electrode of the fourth capacitor, and
wherein the other electrode of the fourth capacitor is electrically connected to the gate of the seventh transistor.

14. The display apparatus according to claim 12,
wherein the second circuit comprises a liquid crystal device as the display device, and
wherein one electrode of the liquid crystal device is electrically connected to the one of the source and the drain of the fourth transistor.

15. The display apparatus according to claim 14, further comprising a fifth capacitor,
wherein one electrode of the fifth capacitor is electrically connected to the one electrode of the liquid crystal device.

16. The display apparatus according to claim 10,
wherein the pixel comprises a transistor,
wherein the transistor in the pixel, the first transistor, the second transistor, and the third transistor each comprise a metal oxide in a channel formation region,
wherein the metal oxide comprise In, Zn, and M, and
wherein M is at least one of Al, Ti, Ga, Sn, Y, Zr, La, Ce, Nd, and Hf.

17. The display apparatus according to claim 10,
wherein the pixel comprises a transistor, and
wherein a channel width of each of the first transistor, the second transistor, and the third transistor is larger than a channel width of the transistor in the pixel.

18. An electronic device comprising the display apparatus according to claim 10, and a camera.

\* \* \* \* \*